US008112249B2

(12) United States Patent  
Gurov et al.

(10) Patent No.: US 8,112,249 B2  
(45) Date of Patent: Feb. 7, 2012

(54) SYSTEM AND METHODS FOR PARAMETRIC TEST TIME REDUCTION

(75) Inventors: Leonid Gurov, Rishon Le Zion (IL); Alexander Chufarovsky, Ashdod (IL); Gil Balog, Jerusalem (IL)

(73) Assignee: Optimaltest Ltd., Nes-Zionna (IL)

( * ) Notice: Subject to any disclaimer, the term of this patent is extended or adjusted under 35 U.S.C. 154(b) by 639 days.

(21) Appl. No.: 12/341,431

(22) Filed: Dec. 22, 2008

(65) Prior Publication Data

US 2010/0161276 A1    Jun. 24, 2010

(51) Int. Cl.  
 G06F 17/18  (2006.01)
(52) U.S. Cl. .......................................... 702/181
(58) Field of Classification Search .............. 702/181, 702/82; 703/7; 345/440; 250/282; 714/736; 382/141

See application file for complete search history.

(56) References Cited

U.S. PATENT DOCUMENTS

| | | | |
|---|---|---|---|
| 4,639,664 A | | 1/1987 | Chiu et al. |
| 5,327,437 A | * | 7/1994 | Balzer .......................... 714/736 |
| 5,386,189 A | | 1/1995 | Nishimura et al. |
| 5,436,979 A | * | 7/1995 | Gray et al. .................... 382/141 |
| 5,477,544 A | | 12/1995 | Botelho |
| 5,539,325 A | | 7/1996 | Rostoker et al. |
| 5,726,920 A | | 3/1998 | Chen et al. |
| 5,736,850 A | | 4/1998 | Legal |
| 5,996,099 A | | 11/1999 | Fournel et al. |
| 6,055,463 A | | 4/2000 | Cheong et al. |
| 6,246,250 B1 | | 6/2001 | Doherty et al. |
| 6,366,109 B1 | | 4/2002 | Matsushita |
| 6,377,901 B1 | | 4/2002 | List et al. |
| 6,618,682 B2 | | 9/2003 | Bulaga et al. |
| 6,711,514 B1 | | 3/2004 | Bibbee |
| 6,751,763 B2 | | 6/2004 | Cho |
| 6,842,022 B2 | | 1/2005 | Khoche |

(Continued)

FOREIGN PATENT DOCUMENTS

JP    2311775    12/1990

(Continued)

OTHER PUBLICATIONS

Bernardo et al. "A General Multivariate Bayesian Process Capability Index", Journal of the Royal Statistical Society. Series D (The Statistician) 45:487-502, 1996.

(Continued)

*Primary Examiner* — Drew A Dunn  
*Assistant Examiner* — Xiuquin Sun  
(74) *Attorney, Agent, or Firm* — Occhiuti Rohlicek & Tsao LLP

(57) ABSTRACT

A parametric test time reduction method for reducing time expended to conduct a test program flow on a population of semiconductor devices, the test program flow comprising at least one parametric test having a specification defining a known pass value range characterized in that a result of the test is considered a passing result if the result falls within the known pass value range, the method including: computing an estimated maximum test range, at a given confidence level, on a validation set including a subset of the population of semiconductor devices, the estimated maximum test range including the range of values into which all results from performing the test on the set will statistically fall at the given confidence level and at least partly disabling the at least one parametric test based at least partly on a comparison of the estimated maximum test range and the known pass value range.

22 Claims, 40 Drawing Sheets

U.S. PATENT DOCUMENTS

| | | |
|---|---|---|
| 6,924,477 B2 * | 8/2005 | DeBono et al. ............... 250/282 |
| 6,936,889 B2 | 8/2005 | Koga et al. |
| 6,937,049 B2 | 8/2005 | Wuidart et al. |
| 6,948,149 B2 | 9/2005 | Goodwin |
| 6,988,232 B2 | 1/2006 | Ricchetti et al. |
| 7,013,231 B2 | 3/2006 | Kritt |
| 7,184,917 B2 | 2/2007 | Pramanick et al. |
| 7,209,851 B2 | 4/2007 | Singh et al. |
| 7,265,570 B2 | 9/2007 | Ong |
| 2004/0044938 A1 | 3/2004 | Heo |
| 2004/0225465 A1 | 11/2004 | Pramanick et al. |
| 2005/0278597 A1 | 12/2005 | Miguelanez et al. |
| 2006/0085155 A1 | 4/2006 | Miguelanez et al. |
| 2006/0100844 A1 | 5/2006 | Yang et al. |
| 2006/0106555 A1 | 5/2006 | Voorakaranam et al. |
| 2007/0260937 A1 | 11/2007 | Connally et al. |
| 2008/0077256 A1 | 3/2008 | Muenz |
| 2008/0117213 A1 * | 5/2008 | Cirit et al. ..................... 345/440 |
| 2008/0281566 A1 * | 11/2008 | Wang et al. ....................... 703/7 |
| 2009/0312972 A1 * | 12/2009 | Muller et al. ................... 702/82 |

FOREIGN PATENT DOCUMENTS

| | | |
|---|---|---|
| JP | 2003197697 | 7/2003 |
| WO | WO 2007/113805 | 10/2007 |

OTHER PUBLICATIONS

Reda et al. "Analyzing the Impact of Process Variations on Parametric Measurements: Novel Models and Applications", Design, Automation & Test in Europe Conference & Exhibition, 375-380, 2009.

Shumaker et al. "Intelligent Sample Test Using Cost Based Methodologies", IEEE Conferences 439-442, 2003.

* cited by examiner

| N (Number of Validation unit) | Result | N (Number of Validation unit) | Result |
| --- | --- | --- | --- |
| Unit 1 | 1.24899399 | Unit 31 | 1.24976802 |
| Unit 2 | 1.25038695 | Unit 32 | 1.24907005 |
| Unit 3 | 1.25007701 | Unit 33 | 1.24907100 |
| Unit 4 | 1.24891603 | Unit 34 | 1.25000000 |
| Unit 5 | 1.24868405 | Unit 35 | 1.24875998 |
| Unit 6 | 1.25015497 | Unit 36 | 1.24922502 |
| Unit 7 | 1.24930298 | Unit 37 | 1.24922705 |
| Unit 8 | 1.24953604 | Unit 38 | 1.25046504 |
| Unit 9 | 1.24814296 | Unit 39 | 1.24953496 |
| Unit 10 | 1.25100696 | Unit 40 | 1.25054204 |
| Unit 11 | 1.25015497 | Unit 41 | 1.24837506 |
| Unit 12 | 1.24899399 | Unit 42 | 1.25085199 |
| Unit 13 | 1.24845302 | Unit 43 | 1.24845004 |
| Unit 14 | 1.24883902 | Unit 44 | 1.24953496 |
| Unit 15 | 1.24969006 | Unit 45 | 1.24938095 |
| Unit 16 | 1.24953604 | Unit 46 | 1.25030994 |
| Unit 17 | 1.24868405 | Unit 47 | 1.24969006 |
| Unit 18 | 1.25038803 | Unit 48 | 1.24876106 |
| Unit 19 | 1.25000000 | Unit 49 | 1.24883902 |
| Unit 20 | 1.24961305 | Unit 50 | 1.25015497 |
| Unit 21 | 1.24938095 | Unit 51 | 1.24852800 |
| Unit 22 | 1.25015497 | Unit 52 | 1.24930298 |
| Unit 23 | 1.24852705 | Unit 53 | 1.24783397 |
| Unit 24 | 1.24953496 | Unit 54 | 1.24914801 |
| Unit 25 | 1.24930406 | Unit 55 | 1.24868202 |
| Unit 26 | 1.25116098 | Unit 56 | 1.25000000 |
| Unit 27 | 1.24775302 | Unit 57 | 1.24775600 |
| Unit 28 | 1.25023305 | Unit 58 | 1.24907005 |
| Unit 29 | 1.24938095 | Unit 59 | 1.24976695 |
| Unit 30 | 1.25000000 | Unit 60 | 1.24969006 |

Figure 4a

| N (Number of Validation unit) | Result | N (Number of Validation unit) | Result |
|---|---|---|---|
| Unit 61 | 1.25007796 | Unit 91 | 1.24930298 |
| Unit 62 | 1.25092995 | Unit 92 | 1.24876106 |
| Unit 63 | 1.24907005 | Unit 93 | 1.24907100 |
| Unit 64 | 1.24984503 | Unit 94 | 1.25077498 |
| Unit 65 | 1.24883902 | Unit 95 | 1.24953496 |
| Unit 66 | 1.24961305 | Unit 96 | 1.25038695 |
| Unit 67 | 1.24953496 | Unit 97 | 1.25007796 |
| Unit 68 | 1.24938095 | Unit 98 | 1.25131595 |
| Unit 69 | 1.24914801 | Unit 99 | 1.24852800 |
| Unit 70 | 1.25015497 | Unit 100 | 1.24976695 |
| Unit 71 | 1.25023198 | Unit 101 | 1.24914801 |
| Unit 72 | 1.24984598 | Unit 102 | 1.25007796 |
| Unit 73 | 1.24845195 | Unit 103 | 1.24992299 |
| Unit 74 | 1.24961305 | Unit 104 | 1.25092900 |
| Unit 75 | 1.25023198 | Unit 105 | 1.24860501 |
| Unit 76 | 1.24845195 | Unit 106 | 1.25015497 |
| Unit 77 | 1.24829698 | Unit 107 | 1.24845302 |
| Unit 78 | 1.25023198 | Unit 108 | 1.25077403 |
| Unit 79 | 1.24937999 | Unit 109 | 1.24984503 |
| Unit 80 | 1.24961305 | Unit 110 | 1.24907100 |
| Unit 81 | 1.25007701 | Unit 111 | 1.24938095 |
| Unit 82 | 1.25092900 | Unit 112 | 1.25000000 |
| Unit 83 | 1.24984503 | Unit 113 | 1.24992204 |
| Unit 84 | 1.24883902 | Unit 114 | 1.24914801 |
| Unit 85 | 1.24914896 | Unit 115 | 1.24914896 |
| Unit 86 | 1.24961400 | Unit 116 | 1.25038695 |
| Unit 87 | 1.24937999 | Unit 117 | 1.24891496 |
| Unit 88 | 1.25061905 | Unit 118 | 1.24938095 |
| Unit 89 | 1.24984598 | Unit 119 | 1.24907100 |
| Unit 90 | 1.25007701 | Unit 120 | 1.25108504 |

Figure 4b

| N (Number of Validation unit) | Result | N (Number of Validation unit) | Result |
|---|---|---|---|
| Unit 121 | 1.24883795 | Unit 151 | 1.24821997 |
| Unit 122 | 1.24953496 | Unit 152 | 1.25007701 |
| Unit 123 | 1.24853003 | Unit 153 | 1.24891496 |
| Unit 124 | 1.25092995 | Unit 154 | 1.24907100 |
| Unit 125 | 1.24937999 | Unit 155 | 1.24907100 |
| Unit 126 | 1.24876106 | Unit 156 | 1.25147200 |
| Unit 127 | 1.24969006 | Unit 157 | 1.24992204 |
| Unit 128 | 1.25108504 | Unit 158 | 1.24907100 |
| Unit 129 | 1.24953496 | Unit 159 | 1.24922705 |
| Unit 130 | 1.25085199 | Unit 160 | 1.24930298 |
| Unit 131 | 1.24938095 | Unit 161 | 1.25015497 |
| Unit 132 | 1.25046504 | Unit 162 | 1.24876106 |
| Unit 133 | 1.24875998 | Unit 163 | 1.25000000 |
| Unit 134 | 1.24899304 | Unit 164 | 1.24961305 |
| Unit 135 | 1.24876106 | Unit 165 | 1.24883902 |
| Unit 136 | 1.25000000 | Unit 166 | 1.24821997 |
| Unit 137 | 1.24930298 | Unit 167 | 1.25162601 |
| Unit 138 | 1.24876201 | Unit 168 | 1.24891496 |
| Unit 139 | 1.24868405 | Unit 169 | 1.24852896 |
| Unit 140 | 1.25077498 | Unit 170 | 1.24845099 |
| Unit 141 | 1.24914706 | Unit 171 | 1.25108397 |
| Unit 142 | 1.24937999 | Unit 172 | 1.24914706 |
| Unit 143 | 1.24883902 | Unit 173 | 1.24852800 |
| Unit 144 | 1.25000000 | Unit 174 | 1.25030994 |
| Unit 145 | 1.25023305 | Unit 175 | 1.25023198 |
| Unit 146 | 1.25023198 | Unit 176 | 1.24891496 |
| Unit 147 | 1.24969101 | Unit 177 | 1.24914801 |
| Unit 148 | 1.25023198 | Unit 178 | 1.24806595 |
| Unit 149 | 1.24891496 | Unit 179 | 1.25061905 |
| Unit 150 | 1.24922597 | Unit 180 | 1.24930203 |

Figure 4c

| N (Number of Validation unit) | Result | N (Number of Validation unit) | Result |
|---|---|---|---|
| Unit 181 | 1.24899304 | Unit 211 | 1.24907100 |
| Unit 182 | 1.24868500 | Unit 212 | 1.24790704 |
| Unit 183 | 1.25015497 | Unit 213 | 1.25007796 |
| Unit 184 | 1.24922502 | Unit 214 | 1.24853003 |
| Unit 185 | 1.24837399 | Unit 215 | 1.24945796 |
| Unit 186 | 1.24821997 | Unit 216 | 1.24922502 |
| Unit 187 | 1.25046504 | Unit 217 | 1.24852800 |
| Unit 188 | 1.24945796 | Unit 218 | 1.24945796 |
| Unit 189 | 1.24930298 | Unit 219 | 1.24907100 |
| Unit 190 | 1.24953604 | Unit 220 | 1.24883795 |
| Unit 191 | 1.25046504 | Unit 221 | 1.24814105 |
| Unit 192 | 1.24821699 | Unit 222 | 1.24876106 |
| Unit 193 | 1.24852896 | Unit 223 | 1.25069702 |
| Unit 194 | 1.25007796 | Unit 224 | 1.24976695 |
| Unit 195 | 1.25015497 | Unit 225 | 1.24790800 |
| Unit 196 | 1.24922502 | Unit 226 | 1.24914896 |
| Unit 197 | 1.24821901 | Unit 227 | 1.24899304 |
| Unit 198 | 1.24961305 | Unit 228 | 1.24907005 |
| Unit 199 | 1.25007701 | Unit 229 | 1.24930298 |
| Unit 200 | 1.25007796 | Unit 230 | 1.24853003 |
| Unit 201 | 1.24984503 | Unit 231 | 1.24984503 |
| Unit 202 | 1.24899399 | Unit 232 | 1.24984503 |
| Unit 203 | 1.24953496 | Unit 233 | 1.24907100 |
| Unit 204 | 1.24875998 | Unit 234 | 1.24945796 |
| Unit 205 | 1.24767601 | Unit 235 | 1.24984503 |
| Unit 206 | 1.24837506 | Unit 236 | 1.24937999 |
| Unit 207 | 1.25015497 | Unit 237 | 1.24953604 |
| Unit 208 | 1.24969006 | Unit 238 | 1.24821997 |
| Unit 209 | 1.24992299 | Unit 239 | 1.25030994 |
| Unit 210 | 1.24876201 | Unit 240 | 1.24852800 |

Figure 4d

| N (Number of Validation unit) | Result | N (Number of Validation unit) | Result |
|---|---|---|---|
| Unit 241 | 1.24829602 | Unit 271 | 1.25154996 |
| Unit 242 | 1.24860704 | Unit 272 | 1.24907005 |
| Unit 243 | 1.25023305 | Unit 273 | 1.24891698 |
| Unit 244 | 1.24945700 | Unit 274 | 1.25069797 |
| Unit 245 | 1.25000000 | Unit 275 | 1.24930203 |
| Unit 246 | 1.24883902 | Unit 276 | 1.25046504 |
| Unit 247 | 1.24969006 | Unit 277 | 1.24868405 |
| Unit 248 | 1.24914801 | Unit 278 | 1.25015497 |
| Unit 249 | 1.24945796 | Unit 279 | 1.24783003 |
| Unit 250 | 1.24976802 | Unit 280 | 1.25015497 |
| Unit 251 | 1.24984503 | Unit 281 | 1.24937999 |
| Unit 252 | 1.24945700 | Unit 282 | 1.25015497 |
| Unit 253 | 1.24930298 | Unit 283 | 1.24845004 |
| Unit 254 | 1.24907100 | Unit 284 | 1.24914896 |
| Unit 255 | 1.24984503 | Unit 285 | 1.24976695 |
| Unit 256 | 1.24961305 | Unit 286 | 1.25023198 |
| Unit 257 | 1.24945796 | Unit 287 | 1.25015497 |
| Unit 258 | 1.24930406 | Unit 288 | 1.24945700 |
| Unit 259 | 1.25023198 | Unit 289 | 1.24860704 |
| Unit 260 | 1.24883795 | Unit 290 | 1.25100803 |
| Unit 261 | 1.24899399 | Unit 291 | 1.24961197 |
| Unit 262 | 1.24837506 | Unit 292 | 1.24891603 |
| Unit 263 | 1.25147200 | Unit 293 | 1.24845195 |
| Unit 264 | 1.25000000 | Unit 294 | 1.24999905 |
| Unit 265 | 1.24945796 | Unit 295 | 1.24860501 |
| Unit 266 | 1.24907100 | Unit 296 | 1.24930298 |
| Unit 267 | 1.24937999 | Unit 297 | 1.24876201 |
| Unit 268 | 1.24875998 | Unit 298 | 1.24969006 |
| Unit 269 | 1.24976802 | Unit 299 | 1.24961305 |
| Unit 270 | 1.24961305 | Unit 300 | 1.25023198 |

Figure 4e

| Vmax | Vmin | Extrapolation Amplitude | Safety Coefficient | Lower Test Range |
|---|---|---|---|---|
| 1.24821997 | 1.24685248 | 0.00136749 | 1.3 | 1.24507475 |

| Serial Number | Lower 5% Test Values of Validation Data | Probabilities | Linear Extrapolation to the Point prob = 0 |
|---|---|---|---|
| 1 | 1.24767601 | 0.00227224 | . |
| 2 | 1.24775302 | 0.00560152 | 1.24762346 |
| 3 | 1.247756 | 0.0089308 | 1.24774801 |
| 4 | 1.24783003 | 0.01226008 | 1.24755742 |
| 5 | 1.24783397 | 0.01558937 | 1.24781555 |
| 6 | 1.24790704 | 0.01891865 | 1.24749179 |
| 7 | 1.247908 | 0.02224793 | 1.24790162 |
| 8 | 1.24806595 | 0.02557721 | 1.24685248 |
| 9 | 1.24814105 | 0.0289065 | 1.24748898 |
| 10 | 1.24814296 | 0.03223578 | 1.24812449 |
| 11 | 1.24821699 | 0.03556506 | 1.24742617 |
| 12 | 1.24821901 | 0.03889435 | 1.24819534 |
| 13 | 1.24821997 | 0.04222363 | 1.24820787 |
| 14 | 1.24821997 | 0.04555291 | 1.24821997 |
| 15 | 1.24821997 | 0.04888219 | 1.24821997 |

| Serial Number | Upper 5% Test Values of Validation Data | Probabilities | Linear Extrapolation to the Point prob = 1 |
|---|---|---|---|
| 1 | 1.250929 | 0.95111781 | . |
| 2 | 1.250929 | 0.95444709 | 1.250929 |
| 3 | 1.25092995 | 0.95777637 | 1.25094205 |
| 4 | 1.25092995 | 0.96110565 | 1.25092995 |
| 5 | 1.25100696 | 0.96443494 | 1.25182961 |
| 6 | 1.25100803 | 0.96776422 | 1.25101842 |
| 7 | 1.25108397 | 0.9710935 | 1.25174329 |
| 8 | 1.25108504 | 0.97442279 | 1.25109329 |
| 9 | 1.25108504 | 0.97775207 | 1.25108504 |
| 10 | 1.25116098 | 0.98108135 | 1.25159249 |
| 11 | 1.25131595 | 0.98441063 | 1.25204161 |
| 12 | 1.251472 | 0.98773992 | 1.25204663 |
| 13 | 1.251472 | 0.9910692 | 1.251472 |
| 14 | 1.25154996 | 0.99439848 | 1.25168113 |
| 15 | 1.25162601 | 0.99772776 | 1.25167792 |

Figure 8a

| Vmax | Vmin | Extrapolation Amplitude | Safety Coefficient | Upper Test Range |
|---|---|---|---|---|
| 1.25204663 | 1.250929 | 0.00111763 | 1.3 | 1.25349956 |

Figure 8b

| Site | Lower 5% Test Values of Validation Data | Probabilities | Linear Extrapolation to the Point prob = 0 | Lower Test Range | | Extrapolation Amplitude | Safety Coefficient | Lower Test Range |
|---|---|---|---|---|---|---|---|---|
| | | | | Vmax | Vmin | | | |
| 1 | 1.24767601 | 0.00453896 | | 1.24781555 | 1.24658367 | 0.00123188 | 1.3 | 1.24498222 |
| | 1.24775302 | 0.01118944 | 1.24762346 | | | | | |
| | 1.247756 | 0.01783992 | 1.24774801 | | | | | |
| | 1.24783003 | 0.02449041 | 1.24755742 | 1010 | | | | |
| | 1.24783397 | 0.03114089 | 1.24781555 | | | | | |
| | 1.247908 | 0.03779137 | 1.24748733 | | 1020 | | | |
| | 1.24814105 | 0.04444186 | 1.24658367 | | | | | |
| 2 | 1.24810893 | 0.00453896 | | 1.24872528 | 1.2470701 | 0.00165518 | 1.3 | 1.24491836 |
| | 1.24810997 | 0.01118944 | 1.24810823 | | | | | |
| | 1.24872801 | 0.01783992 | 1.2470701 | 1030 | | | | |
| | 1.24872903 | 0.02449041 | 1.24872528 | | | | | |
| | 1.24873901 | 0.03114089 | 1.24869228 | | 1040 | | | |
| | 1.24874301 | 0.03779137 | 1.24872028 | | | | | |
| | 1.24886817 | 0.04444186 | 1.24803183 | | | | | |

Figure 10a

| Site | Upper 5% Test Values of Validation Data | Probabilities | Linear Extrapolation to the Point prob = 1 | Upper Test Range ||||| 
|---|---|---|---|---|---|---|---|---|
| | | | | Vmax | Vmin | Extrapolation Amplitude | Safety Coefficient | Upper Test Range |
| 1 | 1.250465504 | 0.09266802 | | 1.25111777 | 1.24965506 | 0.00146271 | 1.3 | 1.2530193 |
| | 1.250619905 | 0.22844535 | 1.25035992 | | | | | |
| | 1.250697002 | 0.36422267 | 1.25048788 | | | | | |
| | 1.25108397 | 0.5 | 1.24965901 | | | | | |
| | 1.251472 | 0.63577733 | 1.24965506 (1050) | | | | | |
| | 1.25154996 | 0.77155465 | 1.25110694 (1060) | | | | | |
| | 1.25162601 | 0.90733198 | 1.25111777 | | | | | |
| 2 | 1.25150111 | 0.09266802 | | 1.25157922 | 1.25092315 | 0.00065608 | 1.3 | 1.25243212 |
| | 1.25150218 | 0.22844535 | 1.25150038 | | | | | |
| | 1.25157922 | 0.36422267 | 1.25137256 | | | | | |
| | 1.25157922 | 0.5 | 1.25157922 (1070) | | | | | |
| | 1.25165519 | 0.63577733 | 1.25129948 | | | | | |
| | 1.25181022 | 0.77155465 | 1.25092924 (1080) | | | | | |
| | 1.25196633 | 0.90733198 | 1.25092315 | | | | | |

Figure 10b

| Difference | -0.00007769 | t Ratio | -8.7292621 |
|---|---|---|---|
| Std Err Dif | 0.00008899 | DF | 297.612438 |
| Upper CL Dif | -0.0006017 | Prob > \|t\| | 2.22E-16 |
| Lower CL Dif | -0.0009952 | Prob > t | 1 |
| Confidence | 0.95 | Prob < t | 1.11E-16 |

Figure 10e

| N Points in Tail | Safety Coefficient | | | | | | |
|---|---|---|---|---|---|---|---|
| | 0.1 | 0.5 | 0.8 | 1 | 1.3 | 1.5 | 2 |
| 5 | 0.0029836850 | 0.0015964736 | 0.0009750078 | 0.0006937973 | 0.0004092881 | 0.0002845661 | 0.0001101131 |
| 6 | 0.0024302839 | 0.0011661830 | 0.0006513281 | 0.0004350591 | 0.0002321226 | 0.0001503734 | 0.0000481276 |
| 7 | 0.0020436258 | 0.0008951640 | 0.0004636619 | 0.0002935454 | 0.0001437948 | 0.0000876996 | 0.0000238543 |
| 8 | 0.0017588860 | 0.0007121746 | 0.0003455483 | 0.0002088047 | 0.0000949397 | 0.0000549277 | 0.0000129533 |
| 9 | 0.0015408672 | 0.0005821700 | 0.0002666163 | 0.0001545888 | 0.0000657870 | 0.0000363155 | 0.0000075402 |
| 10 | 0.0013688370 | 0.0004861359 | 0.0002113925 | 0.0001181006 | 0.0000473506 | 0.0000250543 | 0.0000046365 |
| 11 | 0.0012298049 | 0.0004129711 | 0.0001713277 | 0.0000925397 | 0.0000351422 | 0.0000178902 | 0.0000029805 |
| 12 | 0.0011152264 | 0.0003558139 | 0.0001413914 | 0.0000740412 | 0.0000267500 | 0.0000131429 | 0.0000019876 |
| 13 | 0.0010192559 | 0.0003102241 | 0.0001184702 | 0.0000602878 | 0.0000207993 | 0.0000098886 | 0.0000013672 |
| 14 | 0.0009377624 | 0.0002732179 | 0.0001005550 | 0.0000498270 | 0.0000164680 | 0.0000075931 | 0.0000009655 |
| 15 | 0.0008677458 | 0.0002427261 | 0.0000863042 | 0.0000417145 | 0.0000132439 | 0.0000059339 | 0.0000006976 |
| 20 | 0.0006277375 | 0.0001480449 | 0.0000455322 | 0.0000198165 | 0.0000053098 | 0.0000021072 | 0.0000001777 |
| 25 | 0.0004881941 | 0.0001007581 | 0.0000276513 | 0.0000110798 | 0.0000025965 | 0.0000009360 | 0.0000000606 |
| 30 | 0.0003974652 | 0.0000735066 | 0.0000183610 | 0.0000068709 | 0.0000014409 | 0.0000004796 | 0.0000000249 |
| 35 | 0.0003339971 | 0.0000562635 | 0.0000129699 | 0.0000045781 | 0.0000008730 | 0.0000002714 | 0.0000000117 |
| 40 | 0.0002872416 | 0.0000446088 | 0.0000095874 | 0.0000032157 | 0.0000005643 | 0.0000001652 | 0.0000000060 |
| 50 | 0.0002232047 | 0.0000302319 | 0.0000057732 | 0.0000017763 | 0.0000002708 | 0.0000000717 | 0.0000000020 |

Figure 11

|  | Safety Coefficient = 1.3 | |
| --- | --- | --- |
| N Validation Units | 10% tail | 5% tail |
| 100 | 0.0000864633 | 0.0004092900 |
| 120 | 0.0000480490 | 0.0002321200 |
| 140 | 0.0000291527 | 0.0001437900 |
| 160 | 0.0000188664 | 0.0000949400 |
| 180 | 0.0000128285 | 0.0000657870 |
| 200 | 0.0000090714 | 0.0000473500 |
| 220 | 0.0000066219 | 0.0000351422 |
| 240 | 0.0000049629 | 0.0000267500 |
| 260 | 0.0000038031 | 0.0000208000 |
| 280 | 0.0000029701 | 0.0000164680 |
| 300 | 0.0000023579 | 0.0000132439 |
| 400 | 0.0000008945 | 0.0000053098 |
| 500 | 0.0000004185 | 0.0000025965 |
| 600 | 0.0000002239 | 0.0000014409 |
| 700 | 0.0000001315 | 0.0000008730 |
| 800 | 0.0000000827 | 0.0000005643 |
| 900 | 0.0000000549 | 0.0000003833 |

Figure 12

| SCENARIO | VALIDATION UNITS (FAILURES OF TEST CANDIDATE) | VALIDATION UNITS (ESTIMATED TEST RANGE) | TTR ENABLED (AFTER VALIDATION UNITS) | SAMPLED UNITS (FAILURES OF TEST CANDIDATE) | SAMPLED UNITS (ESTIMATED TEST RANGE) | TTR DISABLED (AFTER SAMPLED UNITS) |
|---|---|---|---|---|---|---|
| 1 | NONE | WITHIN LIMITS | YES | NONE | WITHIN LIMITS | NO |
| 2 | NONE | WITHIN LIMITS | YES | YES | DON'T CARE | YES |
| 3 | NONE | WITHIN LIMITS | YES | NONE | OUTSIDE LIMITS | YES |
| 4 | YES | DON'T CARE | NO | DON'T CARE | DON'T CARE | DON'T CARE |
| 5 | NONE | OUTSIDE LIMITS | NO | DON'T CARE | DON'T CARE | DON'T CARE |

Figure 14

|  | Result Test 2 |  | Result Test 2 |
|---|---|---|---|
| Unit 290 | -2.1103215 | Unit 320 | 0.59943015 |
| Unit 291 | 0.869765 | Unit 321 | 0.40339681 |
| Unit 292 | 0.61172143 | Unit 322 | -1.0558419 |
| Unit 293 | -1.2953824 | Unit 323 | 1.21560149 |
| Unit 294 | 0.28942262 | Unit 324 | 0.90115922 |
| Unit 295 | 0.43807395 | Unit 325 | 1.77844605 |
| Unit 296 | -0.757755 | Unit 326 | -1.1968199 |
| Unit 297 | -0.817587 | Unit 327 | -1.8732938 |
| Unit 298 | -0.5363542 | Unit 328 | -2.2390737 |
| Unit 299 | -0.8903146 | Unit 329 | 2.37532758 |
| Unit 300 | 0.7741976 | Unit 330 | -8.0156743 |
| Unit 301 | -0.6619927 | Unit 331 | 1.41879213 |
| Unit 302 | -1.0968346 | Unit 332 | 0.55585346 |
| Unit 303 | -0.3572646 | Unit 333 | 0.89279075 |
| Unit 304 | 1.95024794 | Unit 334 | -0.9515018 |
| Unit 305 | 0.31364304 | Unit 335 | -1.9955974 |
| Unit 306 | 0.44120726 | Unit 336 | 0.15524347 |
| Unit 307 | -0.7887084 | Unit 337 | -0.8487835 |
| Unit 308 | 0.5655662 | Unit 338 | -1.0695485 |
| Unit 309 | 1.12272968 | Unit 339 | 1.83644011 |
| Unit 310 | 0.90996417 | Unit 340 | 0.61771611 |
| Unit 311 | -0.8294161 | Unit 341 | -0.9095555 |
| Unit 312 | 0.76887487 | Unit 342 | -0.353164 |
| Unit 313 | -0.5739912 | Unit 343 | -1.1124837 |
| Unit 314 | -0.5167937 | Unit 344 | -1.4535354 |
| Unit 315 | -0.7024257 | Unit 345 | 1.70230925 |
| Unit 316 | 1.25435236 | Unit 346 | 0.57151707 |
| Unit 317 | -0.6280745 | Unit 347 | -1.7739678 |
| Unit 318 | -0.0837432 | Unit 348 | -0.0117667 |
| Unit 319 | 0.99953103 | Unit 349 | -0.9817522 |

|  | Lower Test Range Test 2 | Upper Test Range Test 2 |
|---|---|---|
| Unit 300 | -3.9198257 | 5.06087722 |
| Unit 310 | -3.9198257 | 5.04667499 |
| Unit 320 | -3.9198257 | 5.04667499 |
| Unit 330 | -24.657425 | 4.75711624 |

Figure 16b

|         | Result Test 1 |         | Result Test 1 |
|---------|---------------|---------|---------------|
| Unit 280 | 0.29669486 | Unit 310 | 0.90996417 |
| Unit 281 | 0.8101448 | Unit 311 | -0.8294161 |
| Unit 282 | 0.72409495 | Unit 312 | 0.76887487 |
| Unit 283 | 0.81967127 | Unit 313 | -0.5739912 |
| Unit 284 | 0.02303197 | Unit 314 | -0.5167937 |
| Unit 285 | 1.6607029 | Unit 315 | -0.7024257 |
| Unit 286 | 0.49082469 | Unit 316 | 1.25435236 |
| Unit 287 | -0.4685474 | Unit 317 | -0.6280745 |
| Unit 288 | 0.47465517 | Unit 318 | -0.0837432 |
| Unit 289 | -1.2270474 | Unit 319 | 0.99953103 |
| Unit 290 | -2.1103215 | Unit 320 | 0.59943015 |
| Unit 291 | 0.869765 | Unit 321 | 0.40339681 |
| Unit 292 | 0.61172143 | Unit 322 | -1.0558419 |
| Unit 293 | -1.2953824 | Unit 323 | 1.21560149 |
| Unit 294 | 0.28942262 | Unit 324 | 0.90115922 |
| Unit 295 | 0.43807395 | Unit 325 | 1.77844605 |
| Unit 296 | -0.757755 | Unit 326 | -1.1968199 |
| Unit 297 | -0.817587 | Unit 327 | -1.8732938 |
| Unit 298 | -0.5363542 | Unit 328 | -2.2390737 |
| Unit 299 | -0.8903146 | Unit 329 | 2.37532758 |
| Unit 300 | 0.7741976 | Unit 330 | -0.0156743 |
| Unit 301 | -0.6619927 | Unit 331 | 1.41879213 |
| Unit 302 | -1.0968346 | Unit 332 | 0.55585346 |
| Unit 303 | -0.3572646 | Unit 333 | 0.89279075 |
| Unit 304 | 1.95024794 | Unit 334 | -0.9515018 |
| Unit 305 | 0.31364304 | Unit 335 | -1.9955974 |
| Unit 306 | 0.44120726 | Unit 336 | 0.15524347 |
| Unit 307 | -0.7887084 | Unit 337 | -0.8487835 |
| Unit 308 | 0.5655662 | Unit 338 | -1.0695485 |
| Unit 309 | 1.12272968 | Unit 339 | 1.83644011 |

Figure 18a

|  | Result Test 1 |  | Result Test 1 |
|---|---|---|---|
| Unit 340 | 0.61771611 | Unit 370 | -1.6538141 |
| Unit 341 | -0.9095555 | Unit 371 | 0.28364077 |
| Unit 342 | -0.353164 | Unit 372 | 0.92420259 |
| Unit 343 | -1.1124837 | Unit 373 | 0.23307515 |
| Unit 344 | -1.4535354 | Unit 374 | 0.228437 |
| Unit 345 | 1.70230925 | Unit 375 | -0.6597587 |
| Unit 346 | 0.57151707 | Unit 376 | -2.1160689 |
| Unit 347 | -1.7739678 | Unit 377 | -3.5368065 |
| Unit 348 | -0.0117667 | Unit 378 | -2.2395526 |
| Unit 349 | -0.9817522 | Unit 379 | -3.8468213 |
| Unit 350 | -0.1803134 | Unit 380 | -3.0756388 |
| Unit 351 | 1.08379552 | Unit 381 | -3.7748145 |
| Unit 352 | -0.7022151 | Unit 382 | -2.2893912 |
| Unit 353 | 0.5540035 | Unit 383 | -2.0872912 |
| Unit 354 | 1.43611732 | Unit 384 | -2.1878491 |
| Unit 355 | 0.77977718 | Unit 385 | -4.2938874 |
| Unit 356 | 1.10443335 | Unit 386 | -1.7288701 |
| Unit 357 | -0.5427755 | Unit 387 | -3.848908 |
| Unit 358 | -0.9226484 | Unit 388 | -3.0541782 |
| Unit 359 | 0.30360525 | Unit 389 | -1.2797389 |
| Unit 360 | -0.7902236 | Unit 390 | -1.7690436 |
| Unit 361 | -0.5864676 | Unit 391 | -2.9266397 |
| Unit 362 | -0.1343934 | Unit 392 | -1.5487635 |
| Unit 363 | -0.4608412 | Unit 393 | -1.7515183 |
| Unit 364 | -0.5625405 | Unit 394 | -1.1490466 |
| Unit 365 | 0.29899255 | Unit 395 | -1.8452313 |
| Unit 366 | -0.4445108 | Unit 396 | -2.6039109 |
| Unit 367 | -0.2193805 | Unit 397 | -0.9031418 |
| Unit 368 | -0.9517721 | Unit 398 | -4.3160608 |
| Unit 369 | -2.7432485 | Unit 399 | -2.7340501 |

Figure 18b

|  | Result Test 1 |  | Result Test 1 |
|---|---|---|---|
| Unit 400 | -4.2546593 | Unit 430 | -4.6291487 |
| Unit 401 | -2.7993609 | Unit 431 | -6.2276392 |
| Unit 402 | -2.197184 | Unit 432 | -6.4785729 |
| Unit 403 | -2.084548 | Unit 433 | -5.1921977 |
| Unit 404 | -1.7104044 | Unit 434 | -6.3368757 |
| Unit 405 | -3.510077 | Unit 435 | -6.0108119 |
| Unit 406 | -2.1315118 | Unit 436 | -7.3941961 |
| Unit 407 | -2.3264704 | Unit 437 | -6.6795425 |
| Unit 408 | -1.5463167 | Unit 438 | -4.4449265 |
| Unit 409 | -3.6014589 | Unit 439 | -6.8239521 |
| Unit 410 | -1.7810115 | Unit 440 | -4.6294489 |
| Unit 411 | -3.2003162 | Unit 441 | -7.2539889 |
| Unit 412 | -3.3686012 | Unit 442 | -3.9616372 |
| Unit 413 | -5.2501338 | Unit 443 | -7.5403524 |
| Unit 414 | -5.4413305 | Unit 444 | -6.3825829 |
| Unit 415 | -3.7626614 | Unit 445 | -3.2998465 |
| Unit 416 | -5.8810876 | Unit 446 | -7.5188596 |
| Unit 417 | -5.0105663 | Unit 447 | -6.3786487 |
| Unit 418 | -6.6199646 | Unit 448 | -4.7624041 |
| Unit 419 | -5.7322337 | Unit 449 | -4.7870031 |
| Unit 420 | -8.0370456 | Unit 450 | -5.5212134 |
| Unit 421 | -5.6279112 | Unit 451 | -8.854877 |
| Unit 422 | -4.4465107 | Unit 452 | -7.3218363 |
| Unit 423 | -6.0679978 | Unit 453 | -4.9481911 |
| Unit 424 | -6.3955401 | Unit 454 | -6.7822833 |
| Unit 425 | -7.3208683 | Unit 455 | -5.1679275 |
| Unit 426 | -5.7586676 | Unit 456 | -7.2454266 |
| Unit 427 | -5.3239946 | Unit 457 | -5.607411 |
| Unit 428 | -4.8402737 | Unit 458 | -8.504849 |
| Unit 429 | -6.4701815 | Unit 459 | -6.4334985 |

Figure 18c

| Touchdown | Lower Test Range Test 1 | Upper Test Range Test 1 |
|---|---|---|
| Unit 300 | -3.9198257 | 5.06087722 |
| Unit 310 | -3.9198257 | 5.04667499 |
| Unit 320 | -3.9198257 | 5.04667499 |
| Unit 330 | -4.0901637 | 4.75711624 |
| Unit 340 | -4.2523025 | 4.74291401 |
| Unit 350 | -4.2523025 | 4.72871178 |
| Unit 360 | -4.2523025 | 4.72871178 |
| Unit 370 | -4.4144413 | 4.72871178 |
| Unit 380 | -7.3978275 | 4.72871178 |
| Unit 390 | -10.218309 | 4.72871178 |

Figure 18d

|         | Result     |         | Result     |
|---------|------------|---------|------------|
| Unit 1  | 1.24899399 | Unit 31 | 1.24976802 |
| Unit 2  | 1.25038695 | Unit 32 | 1.24907005 |
| Unit 3  | 1.25007701 | Unit 33 | 1.24907100 |
| Unit 4  | 1.24891603 | Unit 34 | 1.25000000 |
| Unit 5  | 1.24868405 | Unit 35 | 1.24875998 |
| Unit 6  | 1.25015497 | Unit 36 | 1.24922502 |
| Unit 7  | 1.24930298 | Unit 37 | 1.24922705 |
| Unit 8  | 1.24953604 | Unit 38 | 1.25046504 |
| Unit 9  | 1.24814296 | Unit 39 | 1.24953496 |
| Unit 10 | 1.25100696 | Unit 40 | 1.25054204 |
| Unit 11 | 1.25015497 | Unit 41 | 1.24837506 |
| Unit 12 | 1.24899399 | Unit 42 | 1.25085199 |
| Unit 13 | 1.24845302 | Unit 43 | 1.24845004 |
| Unit 14 | 1.24883902 | Unit 44 | 1.24953496 |
| Unit 15 | 1.24969006 | Unit 45 | 1.24938095 |
| Unit 16 | 1.24953604 | Unit 46 | 1.25030994 |
| Unit 17 | 1.24868405 | Unit 47 | 1.24969006 |
| Unit 18 | 1.25038803 | Unit 48 | 1.24876106 |
| Unit 19 | 1.25000000 | Unit 49 | 1.24883902 |
| Unit 20 | 1.24961305 | Unit 50 | 1.25015497 |
| Unit 21 | 1.24938095 | Unit 51 | 1.24852800 |
| Unit 22 | 1.25015497 | Unit 52 | 1.24930298 |
| Unit 23 | 1.24852705 | Unit 53 | 1.24783397 |
| Unit 24 | 1.24953496 | Unit 54 | 1.24914801 |
| Unit 25 | 1.24930406 | Unit 55 | 1.24868202 |
| Unit 26 | 1.25116098 | Unit 56 | 1.25000000 |
| Unit 27 | 1.24775302 | Unit 57 | 1.24775600 |
| Unit 28 | 1.25023305 | Unit 58 | 1.24907005 |
| Unit 29 | 1.24938095 | Unit 59 | 1.24976695 |
| Unit 30 | 1.25000000 | Unit 60 | 1.24969006 |

Figure 19a

|          | Result     |          | Result     |
|----------|------------|----------|------------|
| Unit 61  | 1.25007796 | Unit 91  | 1.24930298 |
| Unit 62  | 1.25092995 | Unit 92  | 1.24876106 |
| Unit 63  | 1.24907005 | Unit 93  | 1.24907100 |
| Unit 64  | 1.24984503 | Unit 94  | 1.25077498 |
| Unit 65  | 1.24883902 | Unit 95  | 1.24953496 |
| Unit 66  | 1.24961305 | Unit 96  | 1.25038695 |
| Unit 67  | 1.24953496 | Unit 97  | 1.25007796 |
| Unit 68  | 1.24938095 | Unit 98  | 1.25131595 |
| Unit 69  | 1.24914801 | Unit 99  | 1.24852800 |
| Unit 70  | 1.25015497 | Unit 100 | 1.27976695 |
| Unit 71  | 1.25023198 | Unit 101 | 1.24914801 |
| Unit 72  | 1.24984598 | Unit 102 | 1.25007796 |
| Unit 73  | 1.24845195 | Unit 103 | 1.24992299 |
| Unit 74  | 1.24961305 | Unit 104 | 1.25092900 |
| Unit 75  | 1.25023198 | Unit 105 | 1.24860501 |
| Unit 76  | 1.24845195 | Unit 106 | 1.25015497 |
| Unit 77  | 1.24829698 | Unit 107 | 1.24845302 |
| Unit 78  | 1.25023198 | Unit 108 | 1.25077403 |
| Unit 79  | 1.24937999 | Unit 109 | 1.24984503 |
| Unit 80  | 1.24961305 | Unit 110 | 1.24907100 |
| Unit 81  | 1.25007701 | Unit 111 | 1.24938095 |
| Unit 82  | 1.25092900 | Unit 112 | 1.25000000 |
| Unit 83  | 1.24984503 | Unit 113 | 1.24992204 |
| Unit 84  | 1.24883902 | Unit 114 | 1.24914801 |
| Unit 85  | 1.24914896 | Unit 115 | 1.24914896 |
| Unit 86  | 1.24961400 | Unit 116 | 1.25038695 |
| Unit 87  | 1.24937999 | Unit 117 | 1.24891496 |
| Unit 88  | 1.25061905 | Unit 118 | 1.24938095 |
| Unit 89  | 1.24984598 | Unit 119 | 1.24907100 |
| Unit 90  | 1.25007701 | Unit 120 | 1.25108504 |

|  | Result |  | Result |
|---|---|---|---|
| Unit 121 | 1.24883795 | Unit 151 | 1.24821997 |
| Unit 122 | 1.24953496 | Unit 152 | 1.25007701 |
| Unit 123 | 1.24853003 | Unit 153 | 1.24891496 |
| Unit 124 | 1.25092995 | Unit 154 | 1.24907100 |
| Unit 125 | 1.24937999 | Unit 155 | 1.24907100 |
| Unit 126 | 1.24876106 | Unit 156 | 1.25147200 |
| Unit 127 | 1.24969006 | Unit 157 | 1.24992204 |
| Unit 128 | 1.25108504 | Unit 158 | 1.24907100 |
| Unit 129 | 1.24953496 | Unit 159 | 1.24922705 |
| Unit 130 | 1.25085199 | Unit 160 | 1.24930298 |
| Unit 131 | 1.24938095 | Unit 161 | 1.25015497 |
| Unit 132 | 1.25046504 | Unit 162 | 1.24876106 |
| Unit 133 | 1.24875998 | Unit 163 | 1.25000000 |
| Unit 134 | 1.24899304 | Unit 164 | 1.24961305 |
| Unit 135 | 1.24876106 | Unit 165 | 1.24883902 |
| Unit 136 | 1.25000000 | Unit 166 | 1.24821997 |
| Unit 137 | 1.24930298 | Unit 167 | 1.25162601 |
| Unit 138 | 1.24876201 | Unit 168 | 1.24891496 |
| Unit 139 | 1.24868405 | Unit 169 | 1.24852896 |
| Unit 140 | 1.25077498 | Unit 170 | 1.24845099 |
| Unit 141 | 1.24914706 | Unit 171 | 1.25108397 |
| Unit 142 | 1.24937999 | Unit 172 | 1.24914706 |
| Unit 143 | 1.24883902 | Unit 173 | 1.24852800 |
| Unit 144 | 1.25000000 | Unit 174 | 1.25030994 |
| Unit 145 | 1.25023305 | Unit 175 | 1.25023198 |
| Unit 146 | 1.25023198 | Unit 176 | 1.24891496 |
| Unit 147 | 1.24969101 | Unit 177 | 1.24914801 |
| Unit 148 | 1.25023198 | Unit 178 | 1.24806595 |
| Unit 149 | 1.24891496 | Unit 179 | 1.25061905 |
| Unit 150 | 1.24922597 | Unit 180 | 1.24930203 |

Figure 19c

|  | Result |  | Result |
|---|---|---|---|
| Unit 181 | 1.24899304 | Unit 211 | 1.24907100 |
| Unit 182 | 1.24868500 | Unit 212 | 1.24790704 |
| Unit 183 | 1.25015497 | Unit 213 | 1.25007796 |
| Unit 184 | 1.24922502 | Unit 214 | 1.24853003 |
| Unit 185 | 1.24837399 | Unit 215 | 1.24945796 |
| Unit 186 | 1.24821997 | Unit 216 | 1.24922502 |
| Unit 187 | 1.25046504 | Unit 217 | 1.24852800 |
| Unit 188 | 1.24945796 | Unit 218 | 1.24945796 |
| Unit 189 | 1.24930298 | Unit 219 | 1.24907100 |
| Unit 190 | 1.24953604 | Unit 220 | 1.24883795 |
| Unit 191 | 1.25046504 | Unit 221 | 1.24814105 |
| Unit 192 | 1.24821699 | Unit 222 | 1.24876106 |
| Unit 193 | 1.24852896 | Unit 223 | 1.25069702 |
| Unit 194 | 1.25007796 | Unit 224 | 1.24976695 |
| Unit 195 | 1.25015497 | Unit 225 | 1.24790800 |
| Unit 196 | 1.24922502 | Unit 226 | 1.24914896 |
| Unit 197 | 1.24821901 | Unit 227 | 1.24899304 |
| Unit 198 | 1.24961305 | Unit 228 | 1.24907005 |
| Unit 199 | 1.25007701 | Unit 229 | 1.24930298 |
| Unit 200 | 1.25007796 | Unit 230 | 1.24853003 |
| Unit 201 | 1.24984503 | Unit 231 | 1.24984503 |
| Unit 202 | 1.24899399 | Unit 232 | 1.24984503 |
| Unit 203 | 1.24953496 | Unit 233 | 1.24907100 |
| Unit 204 | 1.24875998 | Unit 234 | 1.24945796 |
| Unit 205 | 1.24767601 | Unit 235 | 1.24984503 |
| Unit 206 | 1.24837506 | Unit 236 | 1.24937999 |
| Unit 207 | 1.25015497 | Unit 237 | 1.24953604 |
| Unit 208 | 1.24969006 | Unit 238 | 1.24821997 |
| Unit 209 | 1.24992299 | Unit 239 | 1.25030994 |
| Unit 210 | 1.24876201 | Unit 240 | 1.24852800 |

Figure 19d

|         | Result     |          | Result     |
|---------|------------|----------|------------|
| Unit 241 | 1.24829602 | Unit 271 | 1.25154996 |
| Unit 242 | 1.24860704 | Unit 272 | 1.24907005 |
| Unit 243 | 1.25023305 | Unit 273 | 1.24891698 |
| Unit 244 | 1.24945700 | Unit 274 | 1.25069797 |
| Unit 245 | 1.25000000 | Unit 275 | 1.24930203 |
| Unit 246 | 1.24883902 | Unit 276 | 1.25046504 |
| Unit 247 | 1.24969006 | Unit 277 | 1.24868405 |
| Unit 248 | 1.24914801 | Unit 278 | 1.25015497 |
| Unit 249 | 1.24945796 | Unit 279 | 1.24783003 |
| Unit 250 | 1.24976802 | Unit 280 | 1.25015497 |
| Unit 251 | 1.24984503 | Unit 281 | 1.24937999 |
| Unit 252 | 1.24945700 | Unit 282 | 1.25015497 |
| Unit 253 | 1.24930298 | Unit 283 | 1.24845004 |
| Unit 254 | 1.24907100 | Unit 284 | 1.24914896 |
| Unit 255 | 1.24984503 | Unit 285 | 1.24976695 |
| Unit 256 | 1.24961305 | Unit 286 | 1.25023198 |
| Unit 257 | 1.24945796 | Unit 287 | 1.25015497 |
| Unit 258 | 1.24930406 | Unit 288 | 1.24945700 |
| Unit 259 | 1.25023198 | Unit 289 | 1.24860704 |
| Unit 260 | 1.24883795 | Unit 290 | 1.25100803 |
| Unit 261 | 1.24899399 | Unit 291 | 1.24961197 |
| Unit 262 | 1.24837506 | Unit 292 | 1.24891603 |
| Unit 263 | 1.25147200 | Unit 293 | 1.24845195 |
| Unit 264 | 1.25000000 | Unit 294 | 1.24999905 |
| Unit 265 | 1.24945796 | Unit 295 | 1.24860501 |
| Unit 266 | 1.24907100 | Unit 296 | 1.24930298 |
| Unit 267 | 1.24937999 | Unit 297 | 1.24876201 |
| Unit 268 | 1.24875998 | Unit 298 | 1.24969006 |
| Unit 269 | 1.24976802 | Unit 299 | 1.24961305 |
| Unit 270 | 1.24961305 | Unit 300 | 1.25023198 |

Figure 19e

|          | Result Test 4 |          | Result Test 4 |
|----------|---------------|----------|---------------|
| Unit 220 | 0.99953103    | Unit 250 | -0.9817522    |
| Unit 221 | 0.59943015    | Unit 251 | -0.1803134    |
| Unit 222 | 0.40339681    | Unit 252 | 1.08379552    |
| Unit 223 | -1.0558419    | Unit 253 | -0.7022151    |
| Unit 224 | 1.21560149    | Unit 254 | 0.5540035     |
| Unit 225 | 0.90115922    | Unit 255 | 1.43611732    |
| Unit 226 | 1.77844605    | Unit 256 | 0.77977718    |
| Unit 227 | -1.1968199    | Unit 257 | 1.10443335    |
| Unit 228 | -1.8732938    | Unit 258 | -0.5427755    |
| Unit 229 | -2.2390737    | Unit 259 | -0.9226484    |
| Unit 230 | 2.37532758    | Unit 260 | 0.30360525    |
| Unit 231 | -0.0156743    | Unit 261 | -0.7902236    |
| Unit 232 | 1.41879213    | Unit 262 | -0.5864676    |
| Unit 233 | 0.55585346    | Unit 263 | -0.1343934    |
| Unit 234 | 0.89279075    | Unit 264 | -0.4608412    |
| Unit 235 | -0.9515018    | Unit 265 | -0.5625405    |
| Unit 236 | -1.9955974    | Unit 266 | 0.29899255    |
| Unit 237 | 0.15524347    | Unit 267 | -0.4445108    |
| Unit 238 | -0.8487835    | Unit 268 | -0.2193805    |
| Unit 239 | -1.0695485    | Unit 269 | -0.9517721    |
| Unit 240 | 1.83644011    | Unit 270 | -2.7432485    |
| Unit 241 | 0.61771611    | Unit 271 | -1.6538141    |
| Unit 242 | -0.9095555    | Unit 272 | 0.28364077    |
| Unit 243 | -0.353164     | Unit 273 | 0.92420259    |
| Unit 244 | -1.1124837    | Unit 274 | 0.23307515    |
| Unit 245 | -1.4535354    | Unit 275 | 0.228437      |
| Unit 246 | 1.70230925    | Unit 276 | -0.6597587    |
| Unit 247 | 0.57151707    | Unit 277 | -2.1160689    |
| Unit 248 | -1.7739678    | Unit 278 | -3.5368065    |
| Unit 249 | -0.0117667    | Unit 279 | -2.2395526    |

Figure 21a

|          | Result Test 4 |          | Result Test 4 |          | Result Test 4 |
|----------|---------------|----------|---------------|----------|---------------|
| Unit 280 | -3.8468213    | Unit 310 | -3.6014589    | Unit 340 | -6.8239521    |
| Unit 281 | -3.0756388    | Unit 311 | -1.7810115    | Unit 341 | -4.6294489    |
| Unit 282 | -3.7748145    | Unit 312 | -3.2003162    | Unit 342 | -7.2539889    |
| Unit 283 | -2.2893912    | Unit 313 | -3.3686012    | Unit 343 | -3.9616372    |
| Unit 284 | -2.0872912    | Unit 314 | -5.2501338    | Unit 344 | -7.5403524    |
| Unit 285 | -2.1878491    | Unit 315 | -5.4413305    | Unit 345 | -6.3825829    |
| Unit 286 | -4.2938874    | Unit 316 | -3.7626614    | Unit 346 | -3.2998465    |
| Unit 287 | -1.7288701    | Unit 317 | -5.8810876    | Unit 347 | -7.5188596    |
| Unit 288 | -3.848908     | Unit 318 | -5.0105663    | Unit 348 | -6.3786487    |
| Unit 289 | -3.0541782    | Unit 319 | -6.6199646    | Unit 349 | -4.7624041    |
| Unit 290 | -1.2797389    | Unit 320 | -5.7322337    | Unit 350 | -4.7870031    |
| Unit 291 | -1.7690436    | Unit 321 | -8.0370456    | Unit 351 | -5.5212134    |
| Unit 292 | -2.9266397    | Unit 322 | -5.6279112    | Unit 352 | -8.854877     |
| Unit 293 | -1.5487635    | Unit 323 | -4.4465107    | Unit 353 | -7.3218363    |
| Unit 294 | -1.7515183    | Unit 324 | -6.0679978    | Unit 354 | -4.9481911    |
| Unit 295 | -1.1490466    | Unit 325 | -6.3955401    | Unit 355 | -6.7822833    |
| Unit 296 | -1.8452313    | Unit 326 | -7.3208683    | Unit 356 | -5.1679275    |
| Unit 297 | -2.6039109    | Unit 327 | -5.7586676    | Unit 357 | -7.2454266    |
| Unit 298 | -0.9031418    | Unit 328 | -5.3239946    | Unit 358 | -5.607411     |
| Unit 299 | -4.3160608    | Unit 329 | -4.8402737    | Unit 359 | -8.504849     |
| Unit 300 | -2.7340501    | Unit 330 | -6.4701815    | Unit 360 | -6.4334985    |
| Unit 301 | -4.2546593    | Unit 331 | -4.6291487    |          |               |
| Unit 302 | -2.7993609    | Unit 332 | -6.2276392    |          |               |
| Unit 303 | -2.197184     | Unit 333 | -6.4785729    |          |               |
| Unit 304 | -2.084548     | Unit 334 | -5.1921977    |          |               |
| Unit 305 | -1.7104044    | Unit 335 | -6.3368757    |          |               |
| Unit 306 | -3.510077     | Unit 336 | -6.0108119    |          |               |
| Unit 307 | -2.1315118    | Unit 337 | -7.3941961    |          |               |
| Unit 308 | -2.3264704    | Unit 338 | -6.6795425    |          |               |
| Unit 309 | -1.5463167    | Unit 339 | -4.4449265    |          |               |

Figure 21b

| Lower Test Range Test 4 | Upper Test Range Test 4 |
|---|---|
| -10.765608 | 5.0856066 |

| Unit 300 |
|---|
| |

Figure 21c

| Unit | Test Value | LSL | HSL | Normalized Test Value | Type | Formula |
|---|---|---|---|---|---|---|
| 1 | 1.24899399 | 1.24 | 1.26 | 0.4496995 | Lower | X = (X-LSL)/(HSL-LSL) |
| 2 | 1.25038695 | | | 0.5193475 | Lower | X = (X-LSL)/(HSL-LSL) |
| 3 | 1.25007701 | | | 0.5038505 | Lower | X = (X-LSL)/(HSL-LSL) |
| 4 | 1.24891603 | | | 0.4458015 | Lower | X = (X-LSL)/(HSL-LSL) |
| 5 | 1.24868405 | | | 0.4342025 | Lower | X = (X-LSL)/(HSL-LSL) |
| 6 | 1.25015497 | | | 0.4922515 | Upper | X = (HSL-X)/(HSL-LSL) |
| 7 | 1.24930298 | | | 0.534851 | Upper | X = (HSL-X)/(HSL-LSL) |
| 8 | 1.24953604 | | | 0.523198 | Upper | X = (HSL-X)/(HSL-LSL) |
| 9 | 1.24814296 | | | 0.592852 | Upper | X = (HSL-X)/(HSL-LSL) |
| 10 | 1.25100696 | | | 0.449652 | Upper | X = (HSL-X)/(HSL-LSL) |

| | | | | | | |
|---|---|---|---|---|---|---|
| LTR | 1.24507475 | | | 0.2537375 | 1.24507475 | L = LSL + (HSL-LSL)*LTR |
| UTR | 1.25349956 | | | 0.325022 | 1.25349956 | U = USL - (HSL-LSL)*LTR |

Figure 22

SYSTEM AND METHODS FOR PARAMETRIC TEST TIME REDUCTION

REFERENCE TO COPENDING APPLICATIONS

The following applications are copending:

| Filed | Published |
|---|---|
| Methods and Systems for Semiconductor Testing using a Testing Scenario Language | |
| PCT/IL2007/000393  27 Mar. 2007  WO 2007/113805  11 Oct. 2007 | |
| Methods and Systems for Semiconductor Testing using Reference Dice | |
| PCT/IL2007/000758  21 Jun. 2007  WO 2008/004209  10 Jan. 2008 | |
| Systems and Methods for Test Time Outlier Detection and Correction in Integrated Circuit Testing | |
| PCT/IL2006/001501  28 Dec. 2006  WO 2008/081419  10 Jul. 2008 | |
| Datalog Management in Semiconductor Testing | |
| PCT/IL2008/000768  05 Jun. 2008 | |
| Universal IC Tester Proxy Interface for Augmentation of Test Performance and Functionality | |
| U.S.A.  61/136,796  1,848,217  03 Oct. 2008 | |

FIELD OF THE INVENTION

The present invention relates generally to testing semiconductor devices and more particularly to parametric testing.

BACKGROUND OF THE INVENTION

State of the art TTR systems are described in U.S. Pat. Nos. 6,618,682 to Bulaga et al and 6,711,514 to Bibbee.

The following U.S. Patents are owned by Applicant:

| Augmenting semiconductor's devices quality and reliability |
|---|
| 7,340,359  04 Mar. 2008 |
| Optimize Parallel Testing |
| 7,208,969  24 Apr. 2007 |

As described by Wikipedia's "Q-Q plot" entry:

"In statistics, a Q-Q plot ("Q" stands for quantile) is a graphical method for diagnosing differences between the probability distribution of a statistical population from which a random sample has been taken and a comparison distribution. An example of the kind of difference that can be tested for, is non-normality of the population distribution.

"For a sample of size n, one plots n points, with the (n+1)-quantiles of the comparison distribution (e.g. the normal distribution) on the horizontal axis (for k=1, ..., n), and the order statistics of the sample on the vertical axis. If the population distribution is the same as the comparison distribution this approximates a straight line, especially near the center. In the case of substantial deviations from linearity, the statistician rejects the null hypothesis of sameness.

"For the quantiles of the comparison distribution typically the formula k/(n+1) is used. Several different formulas have been used or proposed as symmetrical plotting positions. Such formulas have the form (k−a)/(n+1−2a) for some value of a in the range from 0 to ½. The above expression k/(n+1) is one example of these, for a=0. Other expressions include:

$$(k-\tfrac{1}{3})/(n+\tfrac{1}{3})$$

$$(k-00.3175)/(n+0.365)$$

$$(k-0.326)/(n+0.348)$$

$$(k-0.375)/(n+0.25)$$

$$(k-0.44)/(n+0.12)$$

"For large sample size, n, there is little difference between these various expressions."

The disclosures of all publications and patent documents mentioned in the specification, and of the publications and patent documents cited therein directly or indirectly, are hereby incorporated by reference.

SUMMARY OF THE INVENTION

Certain embodiments of the present invention seek to provide improved TTR methods.

There is thus provided, in accordance with at least one embodiment of the present invention, a parametric test time reduction method for reducing time expended to conduct a test program flow on a population of semiconductor devices, the test program flow comprising at least one parametric test having a specification which defines a known pass value range wherein a result of the test is considered a passing result if the result falls within the known pass value range, the method comprising, for at least one parametric test, computing an estimated maximum test range, at a given confidence level, on a validation set comprising a subset of the population of semiconductor devices, the estimated maximum test range comprising the range of values into which all results from performing the test on the set will statistically fall at the given confidence level, the validation set defining a complementary set including all semiconductors included in the population and not included in the validation set; and at least partly disabling the at least one parametric test based at least partly on a comparison of the estimated maximum test range and the known pass value range.

Further in accordance with at least one embodiment of the present invention, the test is at least partly disabled if the estimated maximum test range falls at least partly within the known pass value range.

Still further in accordance with at least one embodiment of the present invention, the test is at least partly disabled if the estimated maximum test range falls entirely within the known pass value range.

Additionally in accordance with at least one embodiment of the present invention, the method also comprises making an on-the-fly determination as to whether the estimated maximum test range falls at least partly within the known pass value range and using the on-the-fly determination as a condition for at least partly re-enabling the at least one parametric test, the on the fly determination comprising re-computing the estimated maximum test range on an on-the-fly generated validation set comprising at least one tested semiconductor device absent from the validation set.

Additionally in accordance with at least one embodiment of the present invention, the method also comprises at least partly disabling the at least one parametric test, irrespective of the comparison, if even one semiconductor device within the validation set fails the parametric test.

Additionally in accordance with at least one embodiment of the present invention, the method also comprises at least partly re-enabling the at least one parametric test, irrespective of the on-the-fly determination, if even one semiconductor device within the on-the-fly generated validation set fails the parametric test.

Further in accordance with at least one embodiment of the present invention, computing an estimated maximum test range comprises performing the parametric test on semiconductor devices included in the validation set, thereby to generate results for the semiconductor devices respectively and selecting from among the semiconductor devices at least one extreme subset including at least one of a high-scoring subset including all devices whose results exceed a high cut-off point and a low-scoring subset including all devices whose results fall below a low cut-off point; Plotting results of the at least one extreme subset as a normal quantile probability plot having a zero probability axis and fitting a plurality of curves to a plurality of subsets of the results respectively; Extending each of the plurality of curves to the zero probability axis thereby to define a corresponding plurality of intersection points and thereby to define a zero probability range along the zero probability axis within which all the intersection points fall; and Defining the estimated maximum test range to include the zero probability range.

Still further in accordance with at least one embodiment of the present invention, the estimated maximum test range includes the zero probability range extended outward by a safety factor.

Still further in accordance with at least one embodiment of the present invention, the subsets of the results comprise result pairs.

Additionally in accordance with at least one embodiment of the present invention, the plurality of subsets of the results comprises all result pairs which are adjacent.

Further in accordance with at least one embodiment of the present invention, the plurality of subsets of the results comprises only result pairs which are adjacent.

Additionally in accordance with at least one embodiment of the present invention, the known pass value range has only a single endpoint and wherein the at least one extreme subset comprises only one extreme subset.

Further in accordance with at least one embodiment of the present invention, the known pass value range has two endpoints.

Also provided, in accordance with at least one embodiment of the present invention, is a parametric test time reduction system for reducing time expended to conduct a test program flow on a population of semiconductor devices, the test program flow comprising at least one parametric test having a specification which defines a known pass value range wherein a result of the test is considered a passing result if the result falls within the known pass value range, the method comprising a parametric test range estimator, operative for at least one parametric test, to compute an estimated maximum test range, at a given confidence level, on an validation set comprising a subset of the population of semiconductor devices, the estimated maximum test range comprising the range of values into which all results from performing the test on the set will statistically fall at the given confidence level, the validation set defining a complementary set including all semiconductors included in the population and not included in the validation set; and a parameter test disabler at least partly disabling the at least one parametric test based at least partly on a comparison of the estimated maximum test range and the known pass value range.

Further in accordance with at least one embodiment of the present invention, the population of semiconductor devices is mounted on wafers and the test program flow comprises a wafer sort test program flow.

Still further in accordance with at least one embodiment of the present invention, the population of semiconductor devices comprises a population of packaged units and the test program flow comprises an FT (final test) test program flow.

Additionally in accordance with at least one embodiment of the present invention, the test is at least partly disabled if the estimated maximum test range falls at least partly within the known pass value range.

Further in accordance with at least one embodiment of the present invention, the test is at least partly disabled if the estimated maximum test range falls entirely within the known pass value range.

Additionally in accordance with at least one embodiment of the present invention, the method also comprises making an on-the-fly determination as to whether the estimated maximum test range falls entirely within the known pass value range and using the on-the-fly determination as a condition for at least partly re-enabling the at least one parametric test, the on-the-fly determination comprising re-computing the estimated maximum test range on an on-the-fly generated validation set comprising at least one tested semiconductor device absent from the validation set.

Still further in accordance with at least one embodiment of the present invention, the condition comprises a necessary condition and/or a sufficient condition.

Further in accordance with at least one embodiment of the present invention, the at least one parametric test is conducted at a plurality of sites in parallel and wherein the estimated maximum test range is computed separately for each site from among the plurality of sites whose test results statistically differ from test results of other sites in the plurality of sites. Still further in accordance with at least one embodiment of the present invention, computing comprises normalizing test results of the subset of the population of semiconductor devices, thereby to generate normalized test results; and computing the estimated test range based on the normalized test results.

Also provided, in accordance with at least one embodiment of the present invention, is a computer usable medium having a computer readable program code embodied therein, the computer readable program code being adapted to be executed to implement at least one of the methods shown and described herein.

Certain embodiments of the present invention are operative to analyze and evaluate parametric test measurements in real-time i.e. during the test as opposed to before or after the test has been performed, in order to decide if and for which portions of a population to be tested, a test (or tests) will be executed. A set of control populations is typically evaluated in real-time. The set of control populations typically includes a first control population also termed herein "Validation units" and a second control population also termed herein "Sampled units".

Certain of the methods provided herein include analyzing test results collected on validation units and extrapolating from these to obtain an estimated maximum test range for non-validation units for which no actual rest range is available since these units have not been tested. If the estimated maximum test range, for a specific test is safely within the test Specification limits, according to suitable criteria for safety which may be user defined, the test is turned off or "TTR'ed" for the upcoming units in the lot. (TTR referring to "test time reduction"). If the estimated maximum test range, for a specific test, exceeds the test specification limits, the test is executed or turned on or kept on or "not TTR'ed", for the upcoming units in the lot. Typically, a decision, based on data collected on validation units, is applied to non-Validation units A similar evaluation is typically executed on additional units in the lot, called "sampled units". Once testing of non-validation units begin, assuming the test candidate is "turned off", sampling of this test begins in order to validate the original decision. Sampling is typically periodical e.g. one unit from each pre-determined number of units is sampled. The data collected on sampled units is added to the population of validation units and the estimated maximum test range is computed anew for each sampled unit based on the combined population. If the estimated maximum test range exceeds the test specification limit/s, the test is turned back on i.e. executed for upcoming units in the lot until such time as further sampling may demand that the test be turned back off, and so on.

Also provided is a computer program product, comprising a computer usable medium having a computer readable program code embodied therein, the computer readable program code adapted to be executed to implement any or all of the methods shown and described herein.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIGS. 4A-4E, taken together, form a table of example test results for an example set of 300 validation units, all provided in accordance with certain embodiments of the present invention.

FIG. 8A is a table of the highest 5% of the values of the normal quantile probability plot of FIG. 5, in accordance with certain embodiments of the present invention.

FIG. 8B is a table of summarizing values computed from the table of FIG. 8A, in accordance with certain embodiments of the present invention.

FIGS. 10A-10E are tables and graphs which compare computations toward test range estimation where only one site is used or multiple sites which do not statistically differ are used, to computations toward test range estimation where multiple, statistically different, sites are used, all in accordance with certain embodiments of the present invention.

FIGS. 11-13 are tables and a graph which are useful in determining various parameters during set-up, in accordance with certain embodiments of the present invention.

FIG. 14 is a table comparing five numerical examples of the operation of the method of FIGS. 1-3 described herein, all provided in accordance with certain embodiments of the present invention.

FIGS. 16A-16B, taken together, form a table with measurements of non-validation units, all provided in accordance with certain embodiments of the present invention.

FIGS. 18A-18D, taken together, form a table presenting measurements of non-validation units, all provided in accordance with certain embodiments of the present invention.

FIGS. 19A-19E, taken together, form a table with measurements of non-validation units, all provided in accordance with certain embodiments of the present invention.

FIGS. 21A-21C, taken together, form a table of measurements of non-validation units, all provided in accordance with certain embodiments of the present invention.

FIG. 22 is a table showing examples of normalization computations, in accordance with certain embodiments of the present invention.

DETAILED DESCRIPTION OF CERTAIN EMBODIMENTS

Figure 1:
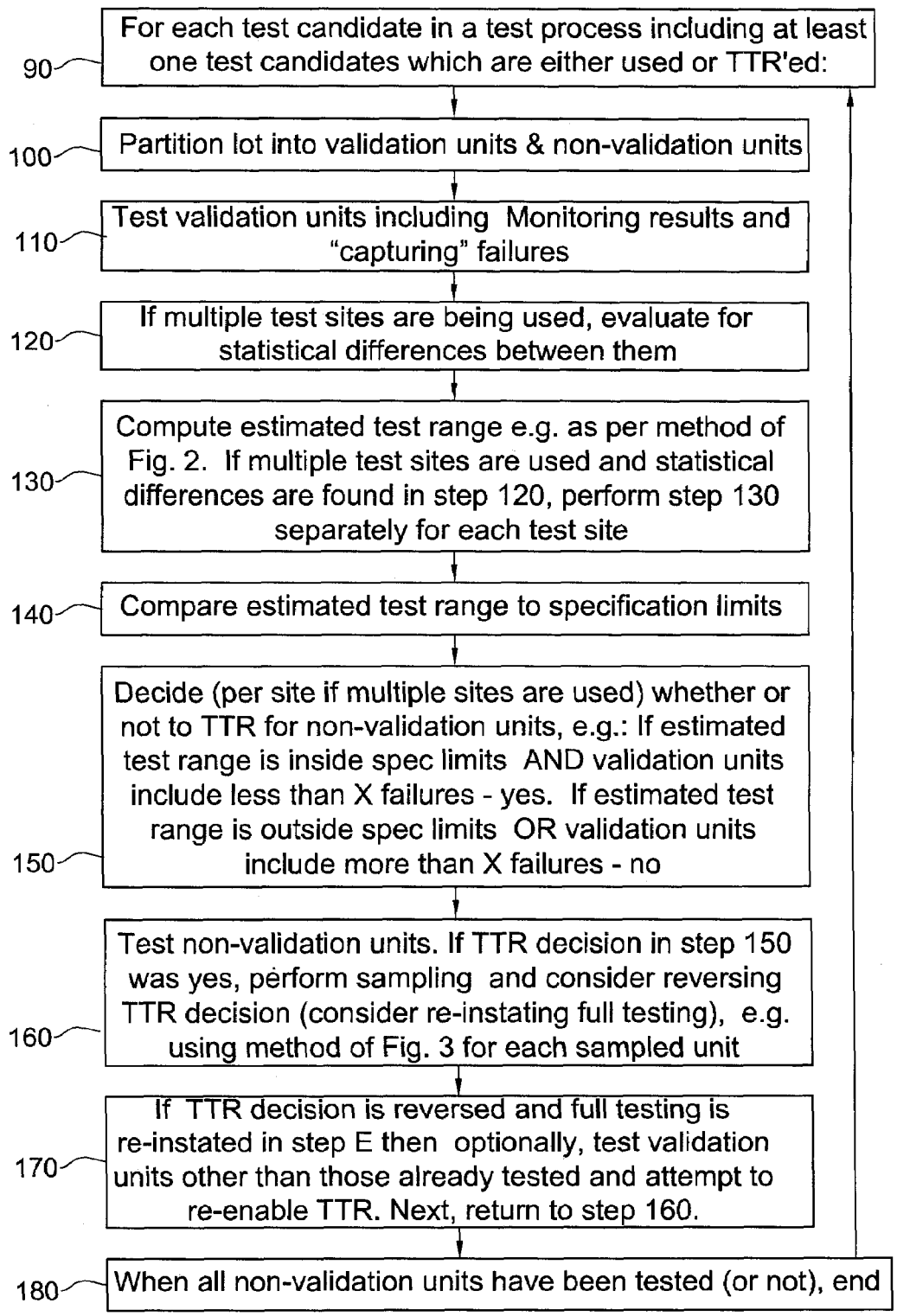
FIG. 1 is a simplified flowchart illustration of a top level method for reducing test time by analyzing an individual parametric test within a test set and selectably disabling that test, the method being operative in accordance with certain embodiments of the present invention.

The following terms may be construed either in accordance with any definition thereof appearing in the prior art literature or in accordance with the specification, or as follows:

T-Test: statistical test used to check a hypothesis equating means of two populations.

ANOVA: analysis-of-variance, a statistical model comparing several sample means to determine whether or not the sampled populations differ significantly.

Linear extrapolation: creating an outwardly extending line at an extremity of a body of data, typically a tangent of a curve fitting the body of data or the portions thereof which are adjacent to the extremity, so as to extend the data outward beyond its limit.

Polynomial extrapolation: extending outward a polynomial curve fitting a body of known data or just extreme values thereof.

Extrapolation: constructing new data points extending beyond a range defined by a discrete set of known data points.

Parametric test: Test yielding measurements (also termed herein "results") which are multi-valued, as opposed to binary pass/fail.

Lot: a population of units to be tested, e.g. parametrically

Site: A testing functionality which may operate in parallel to other testing functionalities, thereby speeding up testing of a lot by allowing the testing process to be performed on several units at a time rather than one unit at a time.

Validation units: units within the lot which are fully tested, typically for all test candidates, thereby to generate measurements which are used to determine which units other than the validation units should and should not be fully tested.

Non-validation units: units within the lot which are not validation units and therefore, may or may not be tested.

Sampling units: A subset of the non-validation units which are fully tested

Actual Test Range or Test Range: range of actual test results. For example if a test was executed on 3 devices and the measurements were 1.5, 2 and 4, the test range is 1.5 to 4.

Specification limits: upper and/or lower limits of a test that define the pass/fail criteria for that test. For example, a test may have a lower specification limit of 1 and an upper specification limit of 4 indicating that if a measurement taken for the specific test is between 1 and 4, the test is passed whereas if the measurement is either below 1 or above 4 the test is failed.

Sampling: performing, on at least one individual semiconductor device within a population to be tested, at least one test which has been disabled, as per a previously formulated disabling decision, for the individual semiconductor device in order to re-validate the disabling decision.

Disabling a test: (a) controlling a test program flow such that a particular "disabled" test is not performed (complete disabling) or is performed on less devices or less frequently or less rigorously or more quickly (partial disabling) or (b) defining the test program flow such that the disabled test is a priori absent or performed on less devices or performed less frequently, less rigorously or more quickly.

Wafer: Interim structure including dies which are also termed herein semiconductor devices.

Vmax: A maximum of various values extrapolated by fitting various curves to various subsets of measurements obtained from a test and extending those curves outward to determine theoretical values whose probability is either zero or one (e.g. by plotting various relatively high or relatively low measurements on a normal quantile probability plot and extending various curves fitted to at least some of those measurements, such as all lines interconnecting adjacent measurements, toward the plot's "probability=1" axis or its "probability=0" axis respectively). Such a maximum may be computed on measurements obtained in a first stage, from validation units or in a second stage, from a combination of validation units and sampled units.

Vmin: A minimum of various values extrapolated by fitting various curves to various subsets of measurements obtained from a test and extending those curves outward to determine theoretical values whose probability is either zero or one (e.g. by plotting various relatively high or relatively low measurements on a normal quantile probability plot and extending various curves fitted to at least some of those measurements, such as all lines interconnecting adjacent measurements, toward the plot's "probability=1" axis or its "probability=0" axis respectively). Such a minimum may be computed on measurements obtained in a first stage, from validation units or in a second stage, from a combination of validation units and sampled units.

Extrapolation Amplitude: Vmax−Vmin
Lower Test Range: Vmin−Safety Coefficient*Extrapolation Amplitude
Upper Test Range: Vmax+Safety Coefficient*Extrapolation Amplitude
Estimated maximum test range: of a lot computed as follows: Maximum Test Range−(Lower Test Range, Upper Test Range). It is appreciated that the estimated maximum test range is typically a result of extrapolation from upper and/or lower tail results of validation units included in the lot.

FIG. 1 is a simplified flowchart illustration of a method for reducing test time by analyzing an individual parametric test within a test set and selectably disabling that test The method of FIG. 1 is typically performed for each test in a battery of tests ("test program") comprising a plurality of tests, such as 100 tests, e.g. sequentially. It is executed for each lot separately and therefore, typically, the method adapts from lot-to-lot. For example, when testing lot A, tests 1-3 might pass the criteria in validation units whereas tests 4-5 might fail the criteria. When testing lot B, different tests may pass and fail the criteria.

The user may decide that a subset of tests in a test program, e.g. tests 1-10 from among a 100-test program, should not be evaluated on a lot by lot basis and should not be subjected to the method of FIG. 1. An example for this includes "must have" tests which, even though they may never fail, must be executed for other reasons such as to protect test hardware, perform preconditioning to other tests, etc.

The method of FIG. 1 uses the upper and lower 5% (say) of the Validation Units and, additionally, Sampled Units, to compute the range of the test values of the units which have not yet been tested and to compare the minimum and maximum of these ranges to the Test Specification Limits.

The method of FIG. 1 typically includes the following steps for each individual test:

Step 100: The lot is "split" (logically) into 2 portions. The first portion includes Validation units and the second portion includes non-Validation units. For example, a lot that includes 10,000 devices may be split into the first 300 units and then the remaining 9700 units. "Full" testing is then performed on the 300 Validation units and based on the results and analysis on these units, a decision will be made on how to test the remaining 9700 non-validation units.

Any suitable methodology, such as simulation techniques and trial and error, may be used during a set-up stage, in order to determine a suitable proportion of the lot to allocate to validation. For example, one suitable method for determining a suitable proportion, during set-up, is described herein below with reference to FIGS. 11-13.

Step 110: Validation units are tested.
Step 120: Site comparison.
Step 130: Compute the estimated maximum test range of the non-validation units based on the data collected in step 120 regarding the Validation units. A suitable method for performing step 130 is described below with reference to FIG. 2.

Step 140: Comparison of estimated test range to specification limits.

Step 150: initial TTR decision based on estimated maximum test range. If the estimated maximum test range of the non-validation units is inside the test's Specification limits—turn off the test and do not apply it to the non-validation units (typically other than for sampled units and other than as per re-decisions based on sampled units as described below). Otherwise, perform the test on the non-validation units.

Step 160: Test non-validation units. Sampling once every N units (N is also termed herein the "sample rate") including "full" testing of, say, one unit, by turning back on (re-enabling), the test that was turned off (disabled) for the units preceding the N'th, 2N'th, etc. units. The sample rate, N, may for example equal 10, or a suitable application-specific value may be determined e.g. by simulation. The measurement obtained from full testing of every N'th unit is added to the measurements obtained from the Validation units and step 130 is repeated. A suitable method for sampling is described below with reference to FIG. 3.

Figure 2:
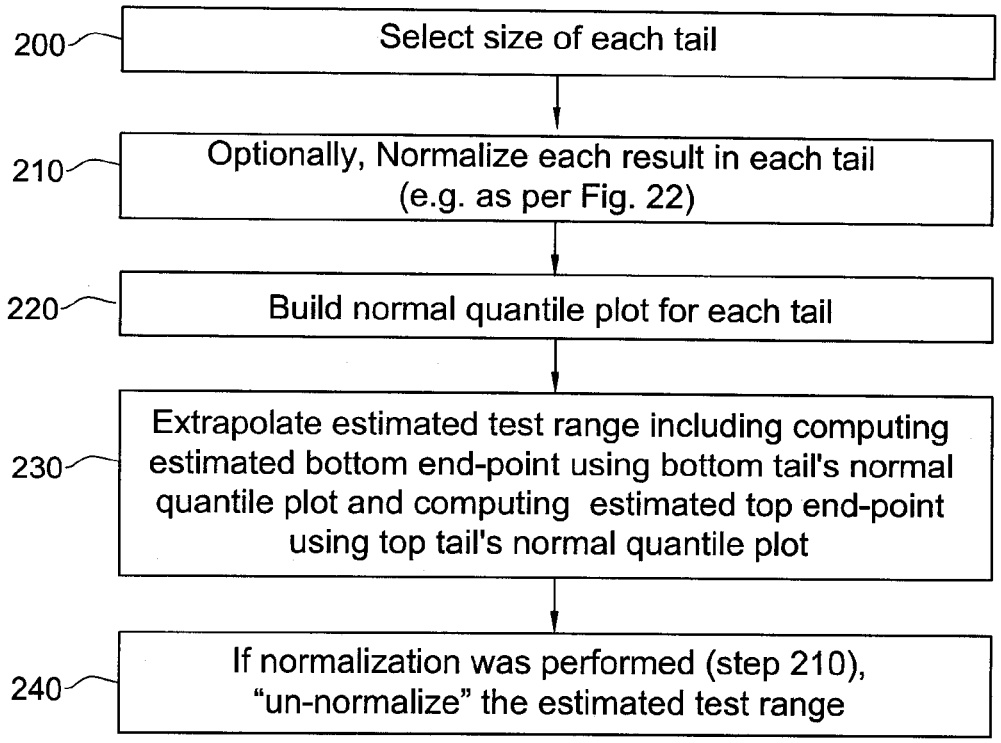
FIG. 2 is a simplified flowchart illustration of a method for performing step 130 in FIG. 1, the method being operative in accordance with certain embodiments of the present invention.

FIG. 2 is a simplified flowchart illustration of a method for performing the estimated maximum test range computation step 130 in FIG. 1. The method of FIG. 2 may be exactly as illustrated and/or may comprise the following operations:

First, select the upper and/or lower 5% (say) of the validation unit population i.e. a high-scoring subset including all devices whose results exceed a high cut-off point and/or a low-scoring subset including all devices whose results fall below a low cut-off point.

It is appreciated that the size of the tail used in step 210 need not be 5% and instead, any suitable tail size may be employed such as 1% or 10%. A suitable method for determining an acceptable tail size, during set up, is described herein below with reference to FIGS. 11-13.

Then, build a normal quantile probability plot for normalized values (or the actual measurements) and select upper 5% (say) and lower 5% (say) of the population. The upper 5% of the plot are used to compute an Upper Test Range in which all values within the upper 5% of the plot fall, and the lower 5% of the plot are used to compute a Lower Test Range in which all values within the lowest 5% of the plot fall. A "normal quantile probability plot" is a term used herein to refer to a plot which resembles a conventional normal quantile plot except that the x axis represents probabilities rather than normal quantiles.

Extrapolate from the sub-set of the validation unit measurements to estimate expected results likely to accrue from non-validation units, which have yet to be tested. The lowest 5% of the population of the non-validation units are used to compute the lower test range (the lowest possible value of the un-tested population). For each pair of points (raw or normalized unit test results) on the normal quantile probability plot take intersection of the straight line, passed through this pair, with the {probability=0} axis of the normal quantile probability plot. Let VMax and VMin be the maximum and minimum y-coordinates respectively of these intersections over all point pairs in the normal quantile probability plot generated in step 210. Optionally, reduce the number of pairs to only those pairs of points which are adjacent when the measurements derived from testing the validation units are ranked. Next, compute the extrapolation amplitude for the range of values of the lowest 5% of the validation unit population: extrapolation amplitude=VMax−VMin. Finally, compute the lower test range of the non-validation unit population by adding a suitable safety factor, also termed herein a "safety coefficient", to the extrapolation amplitude. The estimated lower test range may be computed as follows:

Lower test range=$V$min−extrapolation amplitude*safety coefficient.

The estimated upper test range may be computed as follows:

Upper test range=$V$max+extrapolation amplitude*safety coefficient.

Any suitable methodology, such as simulation techniques and trial and error, may be used during a set-up stage, in order to determine a suitable safety coefficient. For example, one suitable method for determining a suitable safety coefficient during set-up is described hereinbelow with reference to FIGS. 11-13.

Figure 3:
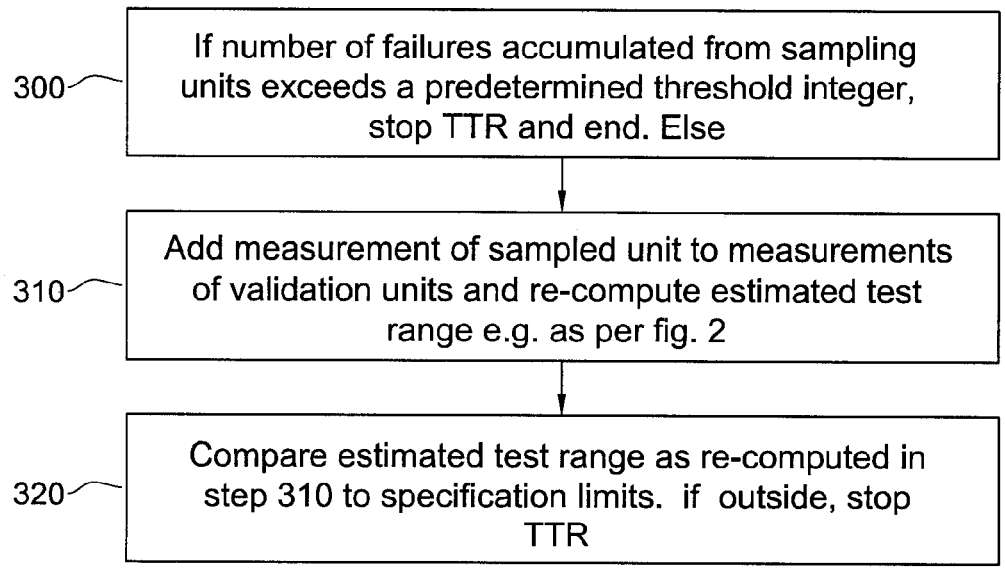
FIG. 3 is a simplified flowchart illustration of a method for performing step 160 in FIG. 1, the method being operative in accordance with certain embodiments of the present invention.

FIG. 3 is a simplified flowchart illustration of a method for performing the estimated maximum test range computation step 150 in FIG. 1. The method of FIG. 3 may be exactly as illustrated and/or may comprise the following operations:

Check if each specific test candidate from among the 300 (say) validation units has failed T times, such as once (e.g. T may be 1), and if so, discontinue the TTR and re-enable the test for the upcoming units in the lot. The failure threshold may be determined based on PPM budget considerations and/or based on the degree of tolerance of failures which characterizes the application.

If the Test range is inside the Specification limits—continue to turn off the test for the following units in the lot (test not executed—TTR'd). If the Test range is outside the Specification limits—turn on the test for the following units in the lot (test executed—not TTR'd).

Optionally, perform a new cycle with additional validation units and tighter limits.

It is appreciated that the particular method shown and described in FIGS. 1-3 is merely exemplary and is not intended to be limiting. For example, the method as shown uses logical combinations of the following two criteria to determine whether or not to TTR or conversely terminate TTR: (a) whether or not the estimated test range is within specification limits and (b) whether or not, de facto, the number of units which fail an individual test exceeds a predetermined threshold. It is appreciated that alternatively, either of the above two criteria may be used in isolation. Also, a different logical combination of the two may be employed. Also, other criteria may be added to or may replace one of criteria (a), (b) above. Also, sampling may be omitted from step 160. Also, step 170 may be omitted or may be performed only once without looping back to step 160. Also, the estimated test range may be computed or determined by any suitable method and not necessarily as per the method of FIG. 2. Additionally, the sampling process per sampled unit need not be in accordance with the method of FIG. 3; for example, the newly estimated test range need not be computed on the basis of combining the raw validation unit measurements and the sampled units and re-computing the estimated test range; instead, the test range as estimated from the validation unit may be suitably and directly modified in accordance with information flowing in from sampled units and/or the TTR reinstating decision may be made on a basis other than estimation of test range and comparison to specification limits.

Example

A numerical example of the operation of the method of FIGS. 1-3 is now described with reference to FIGS. 4A-9.

FIGS. 4A-4E, taken together, form a table of test result measures for an example parametric Test A applied to a lot of 300 validation units.

The lower and upper specification limits (pass/fail limits) for this test are 1.24 and 1.26, respectively.

Figure 5:
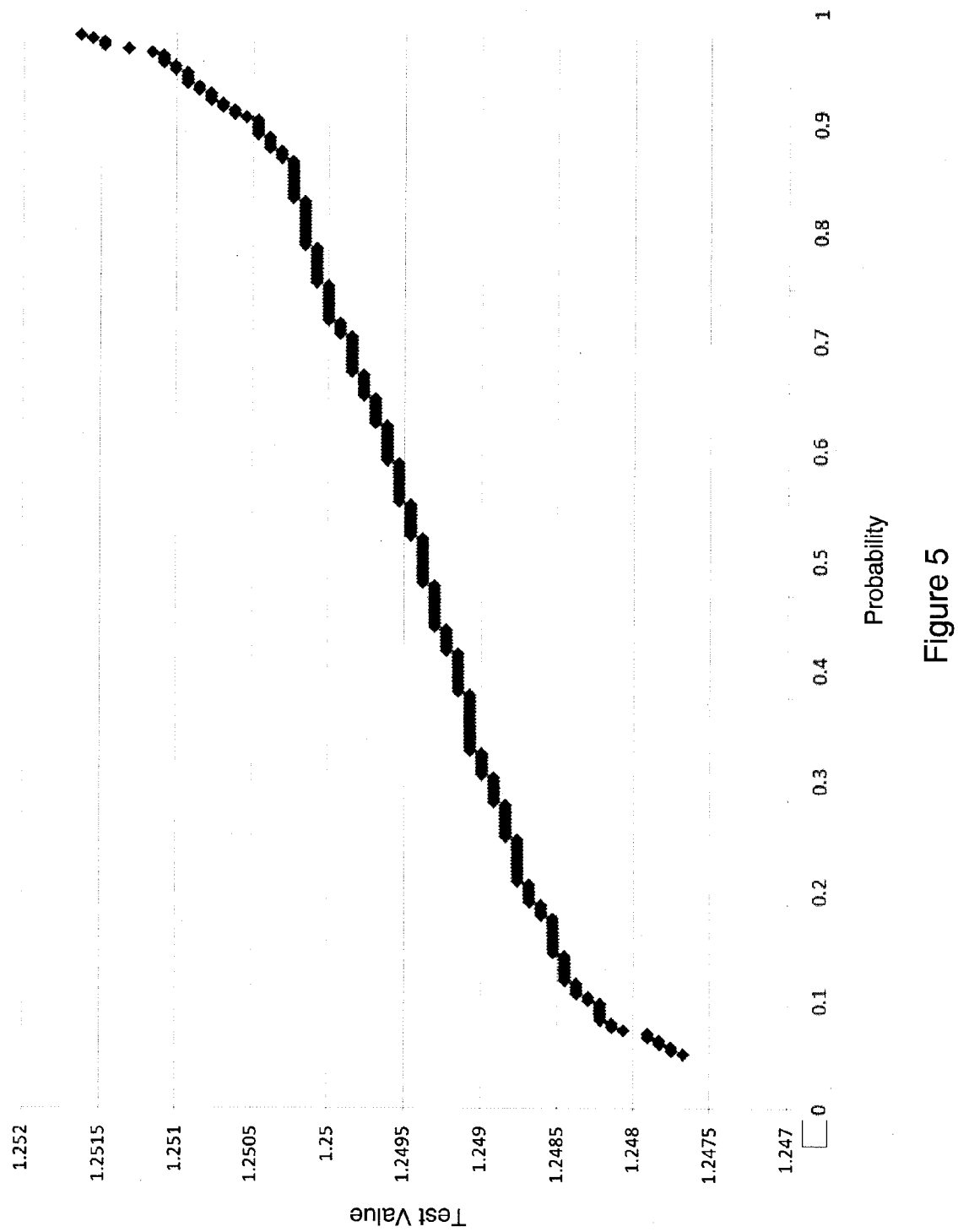
FIG. 5 is an example of a normal quantile probability plot, for the validation unit data of FIG. 4, all provided in accordance with certain embodiments of the present invention.
Figures 6A, 6B:
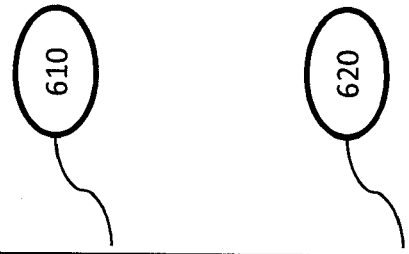
FIG. 6A is a table of the lowest 5% of the values of the normal quantile probability plot of FIG. 5, in accordance with certain embodiments of the present invention.
FIG. 6B is a table of summarizing values computed from the table of FIG. 6A, all provided in accordance with certain embodiments of the present invention.

FIG. 5 is a normal quantile probability plot for the validation unit data of FIG. 4. FIG. 6A is a table of the lowest 5% of the values (i.e. the 5%×300=15 lowest values) of the normal quantile probability plot of FIG. 5. The values themselves are shown in the first, leftmost column. Their respective probabilities are shown in the second, middle column. The probabilities were computed as described in Wikipedia, "Q-Q plot" entry, subsection entitled "Plotting positions".

$$prob[i]=(i-0.3175)/(N+0.365).$$

The linear extrapolations of the to the zero probability axis of the quantile plot i.e. the vertical axis in FIG. 5 is shown in the third, rightmost column. The linear extrapolations were computed using the following formula:

$$Linear\_Extrapolation[i]=y[i-1]-prob[i-1]*((y[i]-y[i-1])/(prob[i]-prob[i-1])),$$

where:
i=counter from 1 to 15
y=Test Values (first column in table of FIG. 6A)
prob=probabilities (second column in table of FIG. 6A)

In FIG. 6A, reference numeral 610 denotes Vmin and 620 denotes Vmax.

FIG. 6B is a table of summarizing values computed from the table of FIG. 6A. Vmax and Vmin are derived in accordance with step 220 in FIG. 2 as described in detail below with reference to FIG. 7. Extrapolation Amplitude (EA) =Vmax−Vmin. Lower Test Range=Vmin−Safety Coefficient*Extrapolation Amplitude, as shown in FIG. 7.

Figure 7:
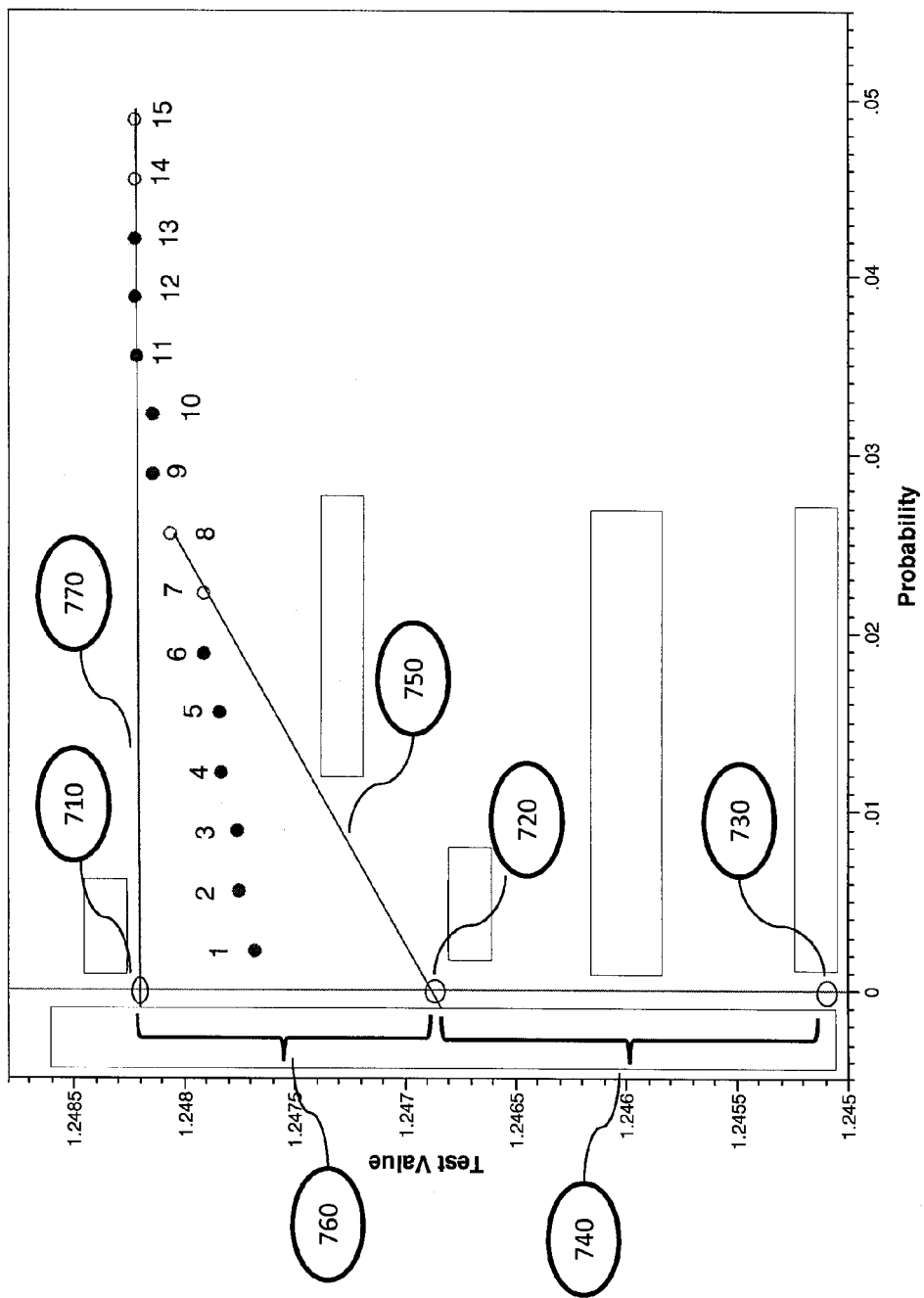
FIG. 7 is a zoom-in of the normal quantile probability plot of FIG. 5 showing only the 15 lowest scoring points, in accordance with certain embodiments of the present invention.

FIG. 7 is a zoom-in of the normal quantile probability plot of FIG. 5 showing only the 15 lowest scoring points. FIG. 7 is useful in understanding the derivation of the Vmax and Vmin values shown in the table of FIG. 6B. The Vmax and Vmin for the 15 lowest values, as described above with reference to step 220 in FIG. 2, are derived as follows: Vmax is the highest point of intersection between lines interconnecting adjacent points and the zero probability axis. Vmin is the lowest point of intersection between lines interconnecting adjacent points and the zero probability axis. In the illustrated example, the pair of points which yields Vmax comprises points 14 and 15 whereas the pair of points which yields Vmin comprises points 7 and 8. In FIG. 7, 710 denotes Vmax, 720 denotes Vmin, 730 denotes Lower Test Range which equals 1.24507, 740 denotes Extrapolation Amplitude*Safety Coefficient, 750 denotes the minimal Extrapolation, 760 denotes the Extrapolation Amplitude and 770 denotes the maximal Extrapolation.

FIG. 8A is a table of the highest 5% of the values (i.e. the 5%×300=15 highest values) of the normal quantile probability plot of FIG. 5. The values themselves are shown in the first, leftmost column. Their respective probabilities are shown in the second, middle column. The probabilities were computed as follows, as per Wikipedia, "Q-Q plot" entry, subsection entitled "Plotting positions":

$$prob[i]=(i-0.3175)/(N+0.365).$$

The linear extrapolations to the zero probability axis of the normal quantile probability plot i.e. the vertical axis in FIG. 5 are shown in the third, rightmost column. The linear extrapolations were computed using the following formula:

$$Linear\_Extrapolation[i]=y[i-1]+(1-prob[i-1]*((y[i]-y[i-1])/(prob[i]-prob[i-1]))),$$

where:
i=counter from 1 to 15
y=Test Values (first column in table of FIG. 8A)
prob=probabilities (second column in table of FIG. 8A)

In FIG. 8A, reference numeral 810 denotes Vmin and 820 denotes Vmax.

FIG. 8B is a table of summarizing values computed from the table of FIG. 8A. Vmax and Vmin are derived in accordance with step 220 in FIG. 2 as described in detail below with reference to FIG. 9. Extrapolation Amplitude (EA) =Vmax−Vmin. Upper Test Range=Vmax+Safety Coefficient*Extrapolation Amplitude, as shown in FIG. 9.

Figure 9:
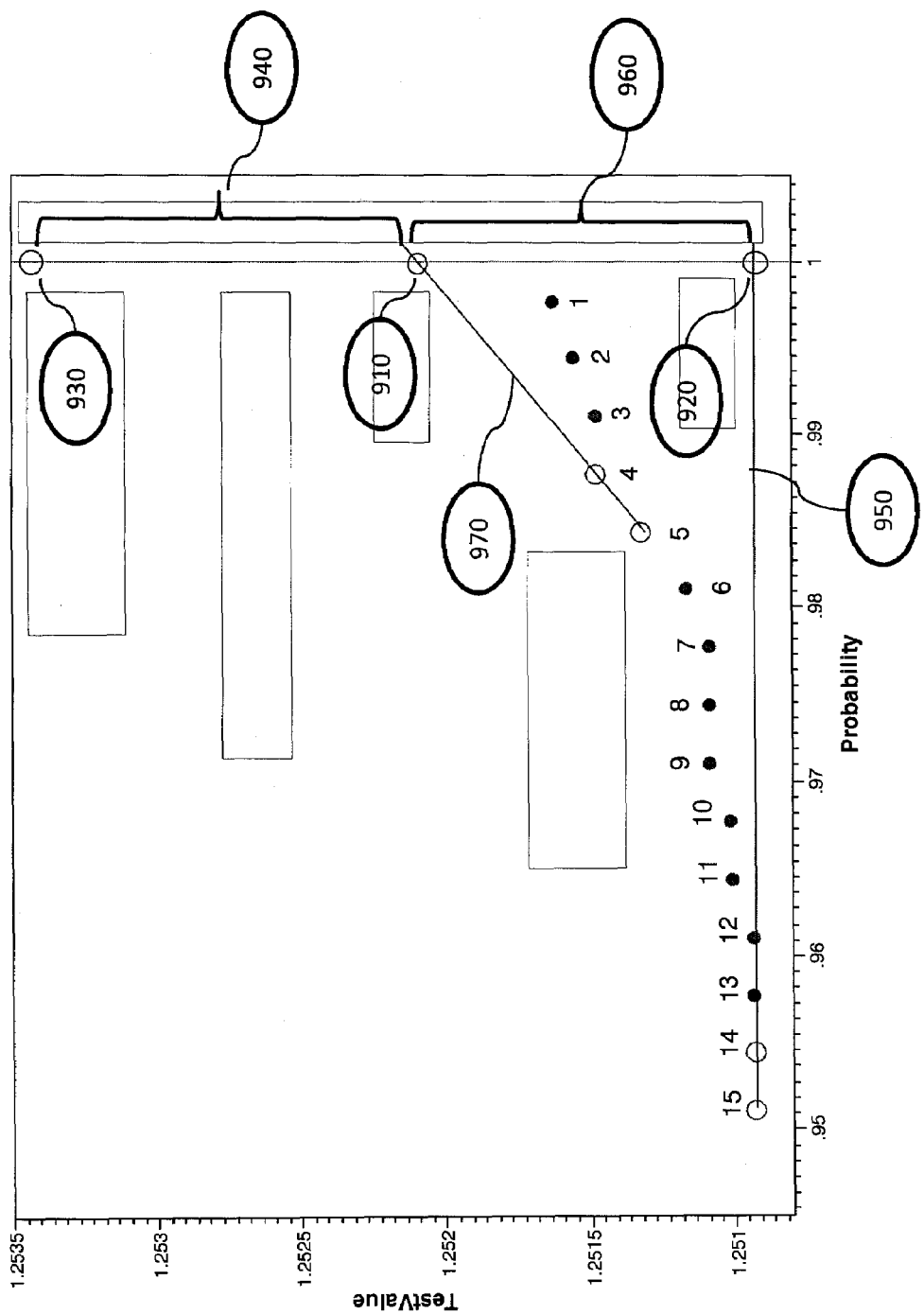
FIG. 9 is a zoom-in of the normal quantile probability plot of FIG. 5 showing only the 15 highest scoring points, in accordance with certain embodiments of the present invention.

FIG. 9 is a zoom-in of the normal quantile probability plot of FIG. 5 showing only the 15 highest scoring points. FIG. 9 is useful in understanding the derivation of the Vmax and Vmin values shown in the table of FIG. 8B. The Vmax and Vmin for the 15 highest values, as described above with reference to step 220 in FIG. 2, are derived as follows: Vmax is the highest point of intersection between lines interconnecting adjacent points and the zero probability axis. Vmin is the lowest point of intersection between lines interconnecting adjacent points and the zero probability axis. In the illustrated example, the pair of points which yields Vmax comprises points 11 and 12 whereas the pair of points which yields Vmin comprises points 1 and 2.

In FIG. 9, reference numeral 910 denotes Vmax, 920 denotes Vmin, 930 denotes the Upper Test Range which equals 1.25349 in the illustrated example, 940 denotes Extrapolation Amplitude*Safety Coefficient, 950 denotes the minimal Extrapolation, 960 denotes Extrapolation Amplitude and 970 denotes the maximal Extrapolation.

Figure 10C:
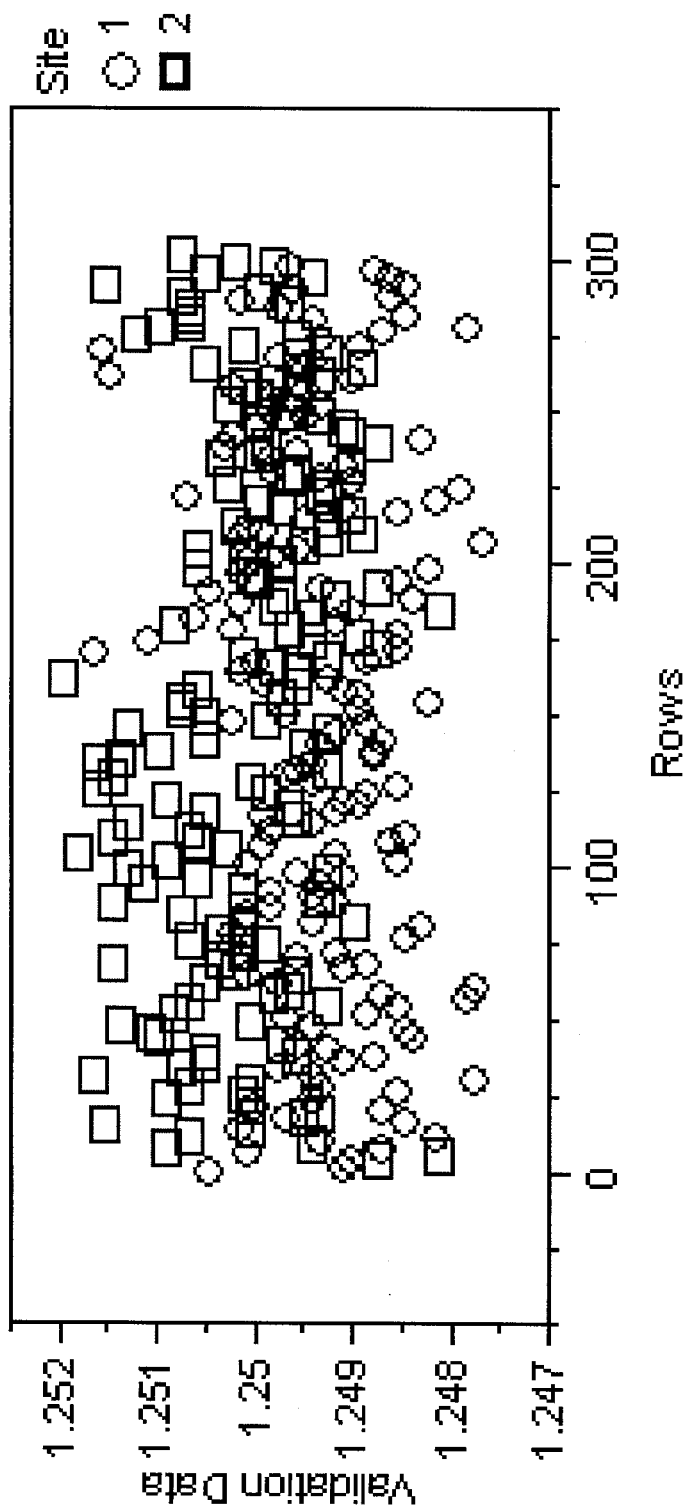
Figure 10D:
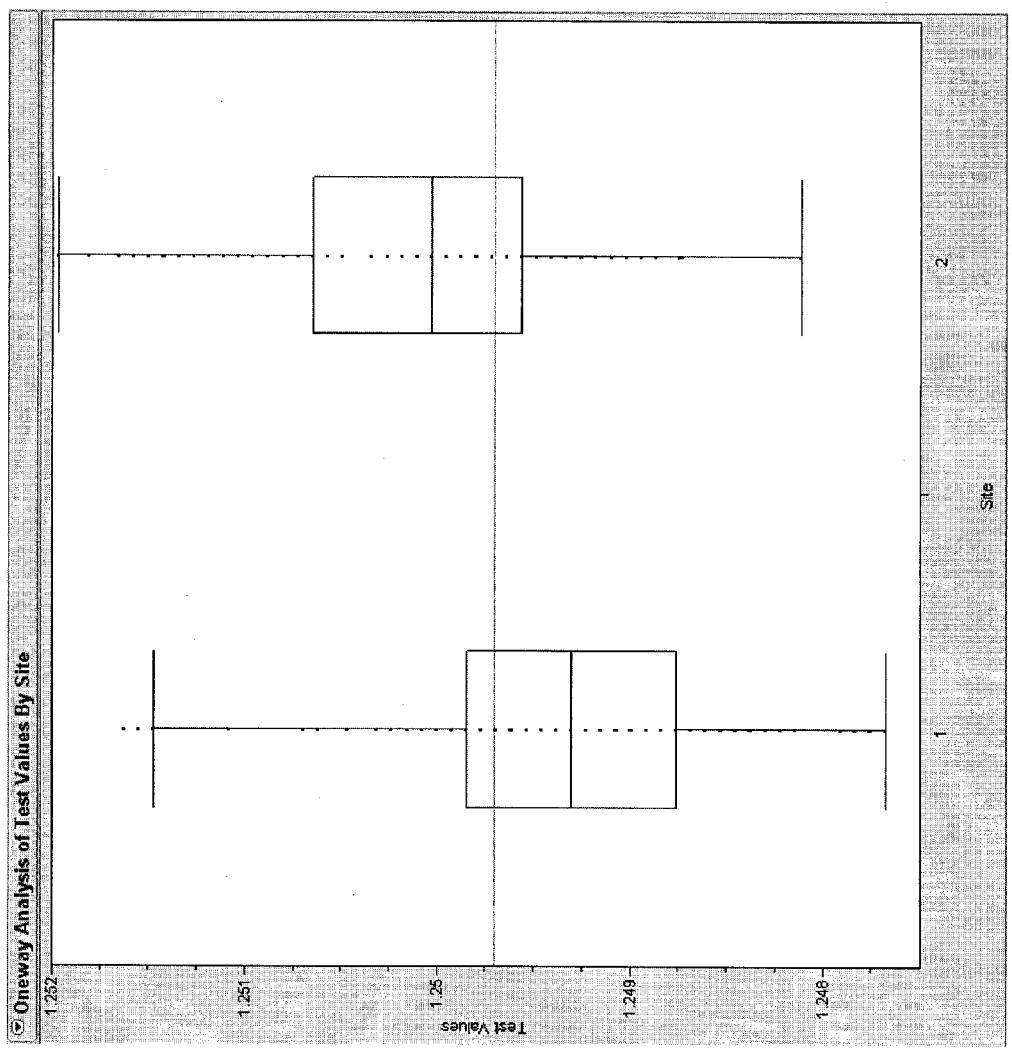

FIGS. 10A-10E compare computations toward test range estimation where only one site is used or multiple sites which do not statistically differ are used, to computations toward test range estimation where multiple, statistically different, sites are used. FIG. 10A shows lower test range computations, similar to those presented above with reference to FIG. 6, but per test-site. In FIG. 10A, 1010 denotes Vmax for Site 1, 1020 denotes Vmin for Site 1, 1030 denotes Vmin for Site 2 and 1040 denotes Vmax for Site 2. FIG. 10B shows upper test range computations, similar to those presented above with reference to FIG. 8, but per test-site. In FIG. 10B, 1050 denotes Vmin for Site 1, 1060 denotes Vmax for Site 1, 1070 denotes Vmax for Site 2 and 1080 denotes Vmin for Site 2. FIG. 10C is a graph of test measurements per test site. FIG. 10D is a box-plot of a t-test used to compare two sites. FIG. 10E is a table of t-test statistics indicating that the two test sites are statistically different in that t values are less than 0.005.

Parallel site considerations are now described with reference to FIG. 1. Regarding step 120, if testing is performed in parallel (more than one unit at the same time, in more than one respective test site) then the validation units are separated into multiple populations. In certain cases, testing of units is performed in parallel to the testing of additional units. For example, in dual-site testing, 2 units are tested at once. In Quad-site testing, 4 units are tested at once. Thus, throughput of testing is increased. If parallelism is 2 there are 2 populations (one for each site) and if parallelism is 4 there are 4 populations (one for each site).

Each population is statistically compared to the other populations in order to check if they are statistically different. This is done since, e.g. due to the nature of the testing hardware; there can be statistical differences between the test-sites in parallel testing. Statistical testing for such differences may be effected just after validation unit testing and before testing of non-validation units begins.

Usually, a T-Test is used when there are 2 test-sites and analysis of variance is used if there are more than 2 test-sites. FIGS. 10D and 10E present the results of a T-Test performed on 2 test sites. In this example, the T-test statistics indicate that the two test sites are statistically different (t values less than 0.005). If the test sites are statistically different, subsequent steps are performed separately for each site. If there is no statistical difference, subsequent steps may be performed once for all sites.

One suitable method for determining, during set-up, (a) a suitable safety coefficient for use in step 220 of FIG. 2; (b) a suitable proportion of the lot to allocate to validation, and (c) the size of the tail used in step 210 of FIG. 2, is now described with reference to FIGS. 11-13.

The user typically tunes the method of FIG. 1 using one or more of the following three parameters: the number of validation units, the percentage of units used for range estimation (size of tail) and a Safety Coefficient. These three parameters can be presented as a 3-dimensional matrix with multiple possible combinations of the settings. There is a balance of all three parameters which the user may take into consideration, on a continuum between confidence and ROI (return on investment). If user selects very high confidence the resulting ROI will be very low. Considerations and methods for selection of these parameters may include the following:

Selection of the Percentage of units (tail). Known methods are based on estimation of distribution characteristics and therefore they are sensitive to the accuracy of the selection of the units in the tail. Because the method of FIGS. 1-3 does not make the prediction based on the tail distribution, the percentage number has less influence on the computation. The recommendation is to use 5%, which for high and low end tails totals 10% from all validation units.

Selection of the number of validation units. This parameter is typically selected in parallel to selection of the Safety coefficient because both parameters influence the confidence of the estimated range. One suitable number is 200. Along with 5% of units for the tail this number provides a sufficient confidence and leaves out most units in an average lot available for the TTR. In most cases a Safety coefficient equal to 1 may be used. For the normal distributions the user can assess the confidence based on the selected number of validation units and the selected Safety Coefficient.

Safety Coefficient. The higher the number, the higher is the confidence in the result, but on the other hand, fewer lots will execute TTR.

Figure 13:
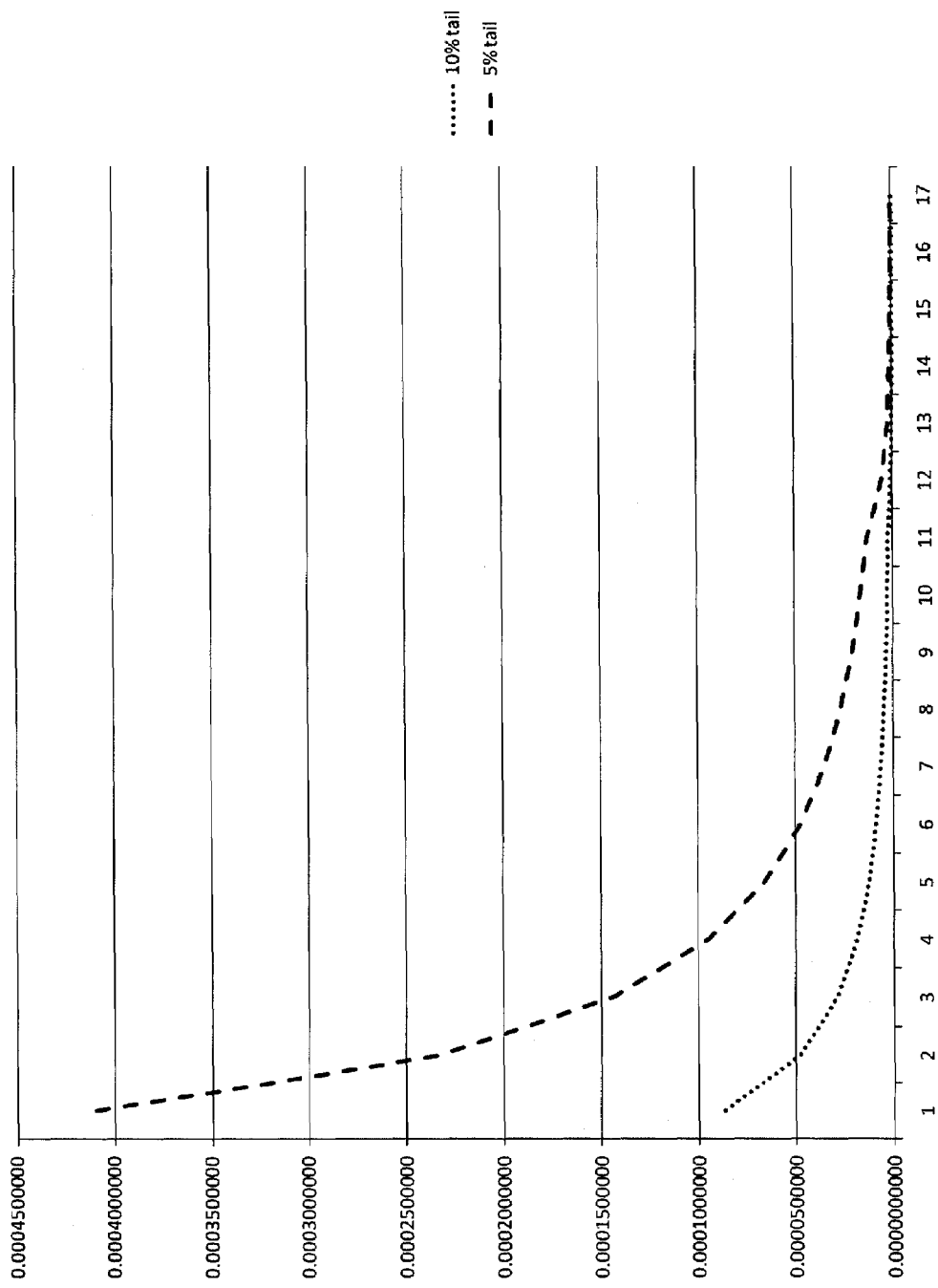

The table of FIG. 11 presents a "slice" of the possible values of the 3 parameters, with a fixed % of units in each tail (5%) and with various numbers of validation units and various safety coefficients. The values presented in the table cells represent the probability of non-validation units values to be out of estimated range. FIGS. 12 and 13 present, in table and graph form respectively, a partial slice where the safety coefficient is fixed at 1.3 and various numbers of validation units, for two separate tail sizes (5% and 10% of units per tail).

Five numerical examples of the operation of the method of FIGS. 1-3 are now described with reference to FIGS. 14-21C. The respective examples, also termed herein "scenarios", are characterized and compared in the table of FIG. 14.

Figure 15A:
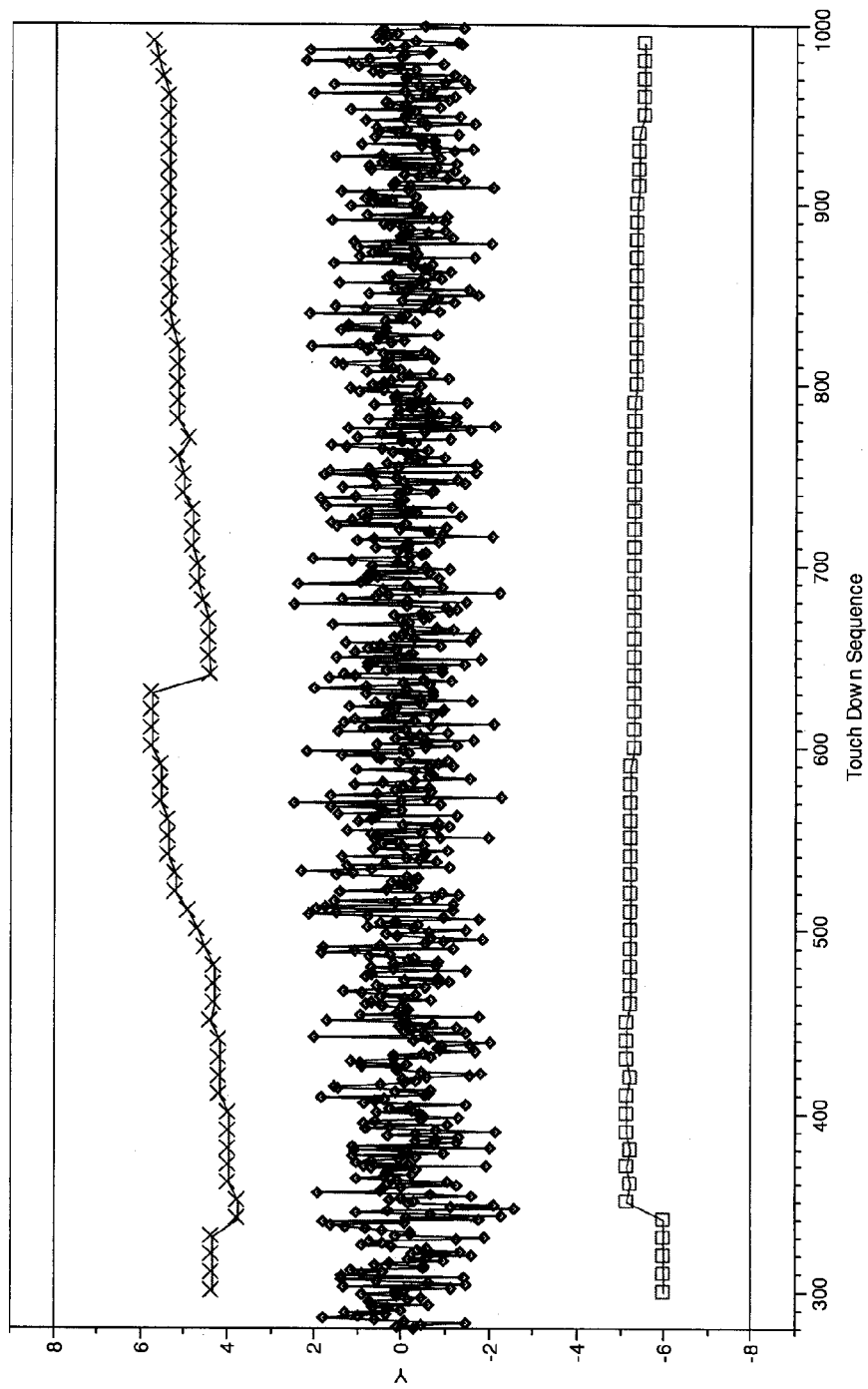
FIG. 15A is a graph of measurements of non-validation units, with the high/low specification limits and the estimated test range, in accordance with certain embodiments of the present invention.

Scenario 1: Analysis on validation units is positive (FIG. 1, Step 150). First, no failures of the test candidate are identified and in addition, the computed estimated test range is within the specification limits. TTR for the test candidate is enabled and during the test of non-validation units (FIG. 1, Step 160), the results of the sampling units were "good" (FIG. 3) throughout the entire lot, meaning that no failures of the test candidate are identified and in addition, the recomputed estimated test range is within the specification limits. TTR is executed on all non-validation units with no issues. FIG. 15A is a graph of measurements of non-validation units, with the high/low specification limits and the estimated test range.

Figure 15B:
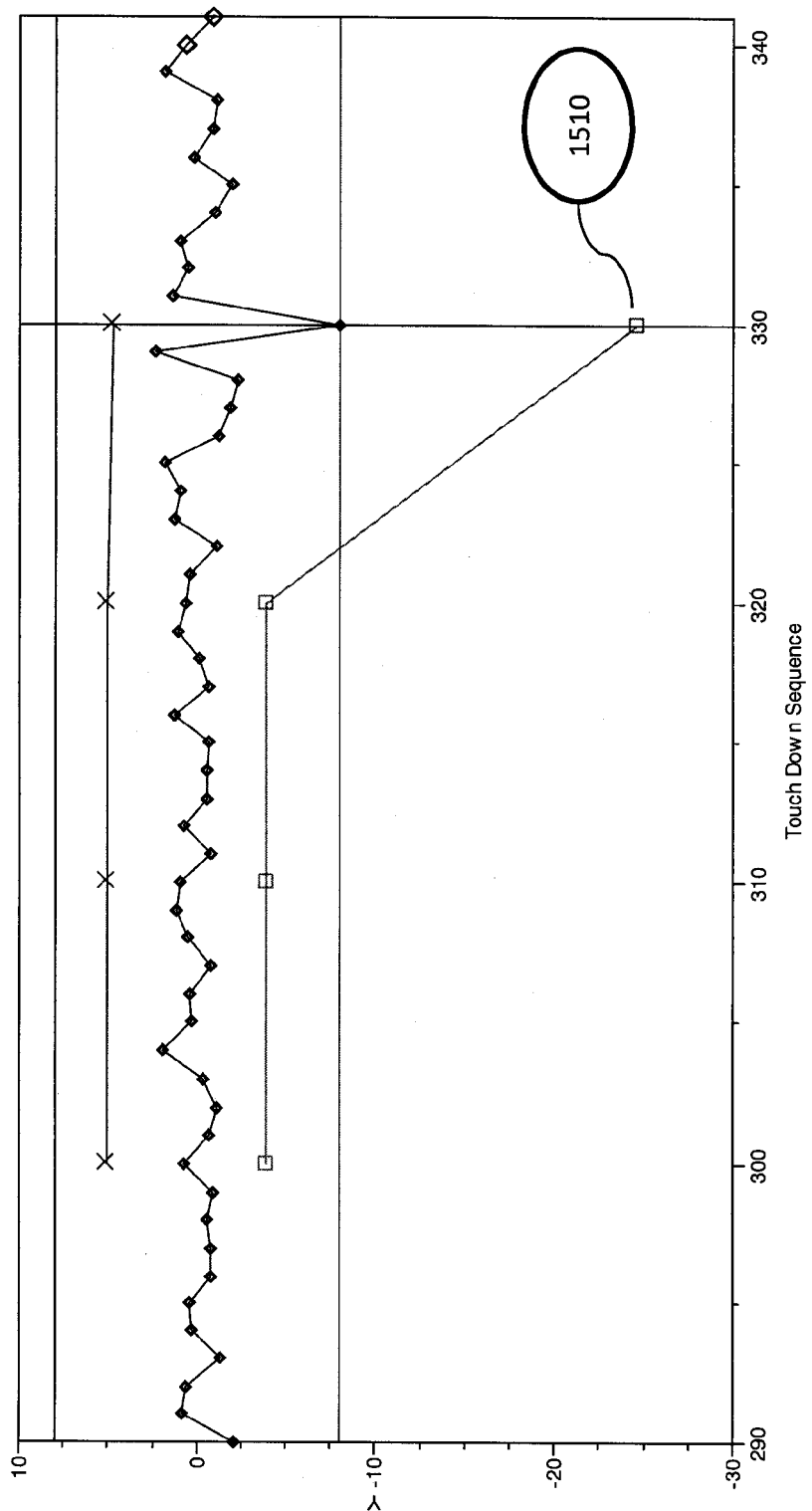
FIG. 15B is a graph of measurements of non-validation units, with the high/low specification limits and the estimated test range, in accordance with certain embodiments of the present invention.

Scenario 2: Analysis on validation units is positive (FIG. 1, Step 150). First, no failures of the test candidate are identified and in addition, the computed estimated test range is within specification limits. TTR for the test candidate has been enabled and during the test of non-validation units (FIG. 1, Step 160), the results of the sampling units are "not good". At a certain point, a failure of the test candidate is identified (FIG. 3, Step 300) and therefore, TTR is disabled from that point on. FIG. 15B is a graph of measurements of non-validation units, with the high/low specification limits and the estimated test range. FIGS. 16A-16B, taken together, form a table with measurements of non-validation units. The measurement for unit 300 is marked as 1610 on FIG. 16a and 1510 on FIG. 15B.

Figure 17:
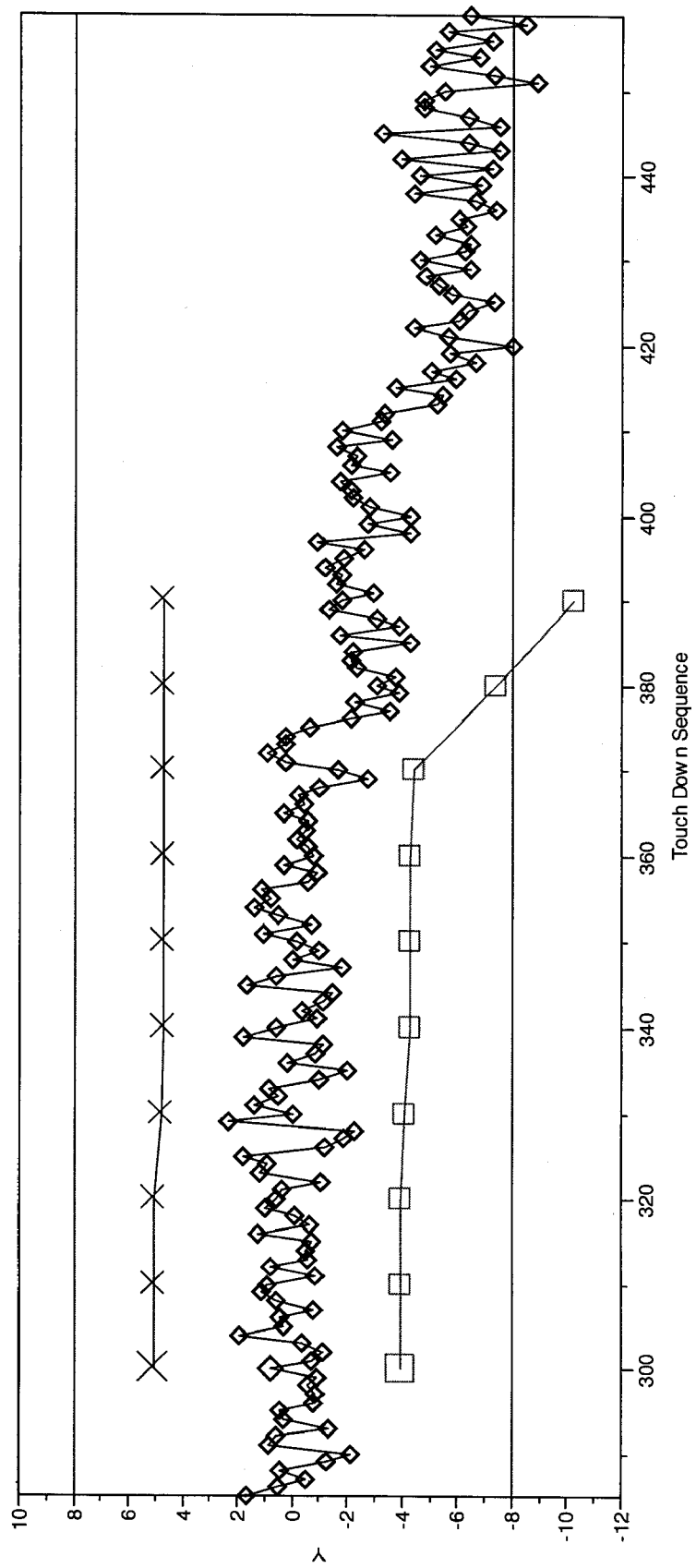
FIG. 17 is a graph of measurements of non-validation units, with the high/low specification limits and the estimated test range, all provided in accordance with certain embodiments of the present invention.

Scenario 3: Analysis on validation units is positive (FIG. 1, Step 150). First, no failures of the test candidate are identified and in addition, the computed estimated test range is within specification limits. TTR for the test candidate is enabled and during the test of non-validation units (FIG. 1, Step 160), the results of the sampling units is "not good". At a certain point, the recomputed estimated test range is outside the specification limits and therefore (FIG. 3, Step 320), TTR is disabled from that point further. FIG. 17 is a graph of measurements of non-validation units, with the high/low specification limits and the estimated test range. FIGS. 18A-18D, taken together, form a table presenting measurements of non-validation units.

Scenario 4: Analysis on validation units is not positive (FIG. 1, Step D(2)). A failure of the test candidate has been identified and therefore, no TTR has been performed for the non-validation units. FIGS. 19A-19E, taken together, form a table with measurements of non-validation units. The measurement for unit 100 is marked as 1910 on FIG. 19B.

Figure 20:
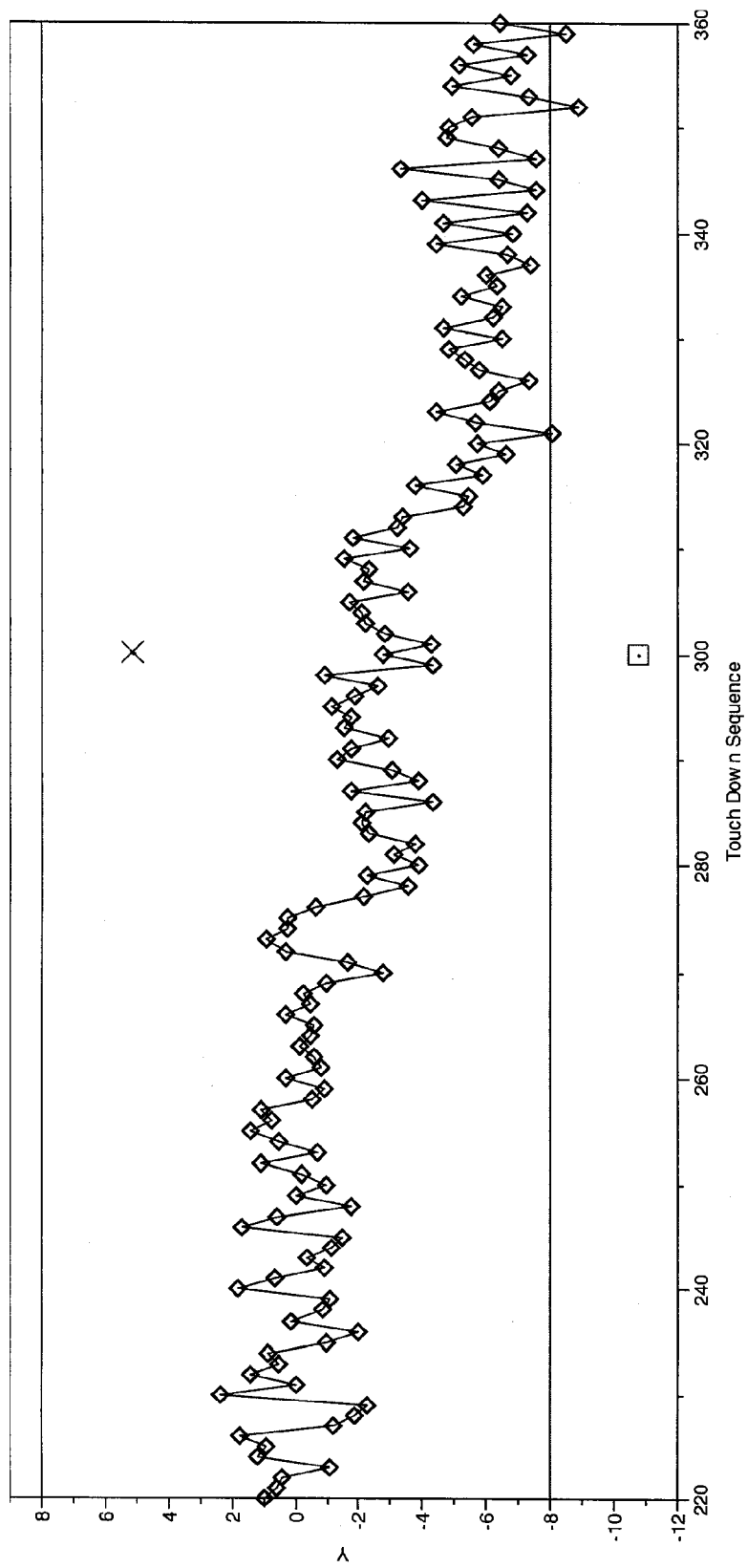
FIG. 20 is a graph of measurements of non-validation units, with the high/low specification limits and the estimated test range, all provided in accordance with certain embodiments of the present invention.

Scenario 5: Analysis on validation units is not positive (FIG. 1, Step 150). The computed estimated test range is outside the specification limits and therefore, no TTR is performed for the non-validation units. FIG. 20 is a graph of measurements of non-validation units, with the high/low specification limits and the estimated test range. FIGS. 21A-21C, taken together, form a table of measurements of non-validation units.

Normalization: Referring again to FIG. 2, optionally, test values of all validation units may be normalized in step 210, e.g. as follows:

$$X_{normalized\ for\ lower\ range} = (X-LSL)/(USL-LSL) \text{ and}$$

$$X_{normalized\ for\ upper\ range} = (USL-X)/(USL-LSL),$$

where: X—Test value, LSL denotes Lower Specification Limit and USL denotes Upper Specification Limit. Normalization is effective if the extrapolation method is not linear e.g. is polynomial.

If normalization is performed in step 210 then in Step 220, the upper and lower test ranges that were computed need to be "un-normalized". In order to do so, the actual range limits may be computed as:

Lower Limit=LSL+(*HSL*-LSL)*Lower Test Range;
and

Upper Limit=USL-(*HSL*-LSL)*Upper Test Range.

FIG. 22 is a table showing examples of normalization computations.

Optionally, the population of units under test comprises semiconductor devices mounted on wafers and the test program flow comprises a wafer sort test program flow. Alternatively or in addition, the population of units under test may include a population of packaged semiconductors and the test program flow comprises an FT (final test) test program flow.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Also included in the scope of the present invention, is a computer program product, comprising a computer usable medium having a computer readable program code embodied therein, the computer readable program code being adapted to be executed to implement one, some or all of the methods shown and described herein. It is appreciated that any or all of the computational steps shown and described herein may be computer-implemented.

Unless specifically stated otherwise, as apparent from the following discussions, it is appreciated that throughout the specification discussions utilizing terms such as "processing", "computing", "calculating", "determining", or the like, refer to the action and/or processes of a computer that manipulate and/or transform data into other data, the data represented as physical, e.g. such as electronic, quantities. The term "computer" should be expansively construed to cover any kind of electronic device with data processing capabilities, including, by way of non-limiting example, personal computers, servers, computing systems, communication devices, processors (e.g. digital signal processor (DSP), microcontrollers, field programmable gate array (FPGA), application specific integrated circuit (ASIC), etc.) and other electronic computing devices.

The operations in accordance with the teachings herein may be performed by a computer specially constructed for the desired purposes or by a general purpose computer specially configured for the desired purpose by a computer program stored in a computer readable storage medium.

In addition, embodiments of the present invention are not described with reference to any particular programming language. It will be appreciated that a variety of programming languages may be used to implement the teachings of the inventions as described herein.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. A parametric test time reduction method for reducing time expended to conduct a test program flow on a population of semiconductor devices, the test program flow comprising at least one parametric test having a specification which defines a known pass value range wherein a result of the test is considered a passing result if the result falls within said known pass value range, the method comprising:

for at least one parametric test, computing an estimated maximum test range, at a given confidence level, on a validation set comprising a subset of the population of semiconductor devices, the estimated maximum test range comprising the range of values into which all results from performing said test on said set will statistically fall at said given confidence level, said validation set defining a complementary set including all semiconductors included in said population and not included in said validation set; and at least partly disabling said at least one parametric test based at least partly on a comparison of said estimated maximum test range and said known pass value range, wherein said computing an estimated maximum test range comprises:

performing said parametric test on semiconductor devices included in said validation set, thereby to generate results for said semiconductor devices respectively and selecting from among said semiconductor devices at least one extreme subset including at least one of a high-scoring subset including all devices whose results exceed a high cut-off point and a low-scoring subset including all devices whose results fall below a low cut-off point;

plotting results of said at least one extreme subset as a normal quantile probability plot having a zero probability axis and fitting a plurality of curves to a plurality of subsets of said results respectively;

extending each of said plurality of curves to said zero probability axis thereby to define a corresponding plurality of intersection points and thereby to define a zero probability range along said zero probability axis within which all said intersection points fall; and defining said estimated maximum test range to include said zero probability range.

2. A method according to claim 1 wherein said test is at least partly disabled if said estimated maximum test range falls at least partly within said known pass value range.

3. A method according to claim 1 wherein said test is at least partly disabled if said estimated maximum test range falls entirely within said known pass value range.

4. A method according to claim 1 and also comprising making an on-the-fly determination as to whether said estimated maximum test range falls at least partly within said known pass value range and using said on-the-fly determination as a condition for at least partly re-enabling said at least one parametric test, said on-the-fly determination comprising re-computing said estimated maximum test range on an on-the-fly generated validation set comprising at least one tested semiconductor device absent from said validation set.

5. A method according to claim 4 and also comprising at least partly re-enabling said at least one parametric test, irrespective of said on-the-fly determination, if even one semiconductor device within said on-the-fly generated validation set fails said parametric test.

6. A method according to claim 1 and also comprising at least partly disabling said at least one parametric test, irrespective of said comparison, if even one semiconductor device within said validation set fails said parametric test.

7. A method according to claim 1 wherein said estimated maximum test range includes said zero probability range extended outward by a safety factor.

8. A method according to claim 1 wherein said subsets of said results comprise result pairs.

9. A method according to claim 1 wherein said plurality of subsets of said results comprises all result pairs which are adjacent.

10. A method according to claim 1 wherein said plurality of subsets of said results comprises only result pairs which are adjacent.

11. A method according to claim 1 wherein said known pass value range has only a single endpoint and wherein said at least one extreme subset comprises only one extreme subset.

12. A method according to claim 1 wherein said known pass value range has two endpoints.

13. A method according to claim 1 wherein said population of semiconductor devices is mounted on wafers and said test program flow comprises a wafer sort test program flow.

14. A method according to claim 1 wherein said population of semiconductor devices comprises a population of packaged units said test program flow comprises an FT (final test) test program flow.

15. A method according to claim 1 wherein said test is at least partly disabled if said estimated maximum test range falls at least partly within said known pass value range.

16. A method according to claim 1 wherein said test is at least partly disabled if said estimated maximum test range falls entirely within said known pass value range.

17. A method according to claim 1 and also comprising making an on-the-fly determination as to whether said estimated maximum test range falls entirely within said known pass value range and using said on-the-fly determination as a condition for at least partly re-enabling said at least one parametric test, said on-the-fly determination comprising re-computing said estimated maximum test range on an on-the-fly generated validation set comprising at least one tested semiconductor device absent from said validation set.

18. A method according to claim 17 wherein said condition comprises a necessary condition.

19. A method according to claim 17 wherein said condition comprises a sufficient condition.

20. A method according to claim 1 wherein said at least one parametric test is conducted at a plurality of sites in parallel and wherein the estimated maximum test range is computed separately for each site from among said plurality of sites whose test results statistically differ from test results of other sites in said plurality of sites.

21. A method according to claim 1 where said computing comprises:

normalizing test results of said subset of the population of semiconductor devices, thereby to generate normalized test results; and computing said estimated test range based on said normalized test results.

22. A non-transitory computer-readable medium having a computer readable program code embodied therein, the computer readable program code being adapted to be executed to implement the method of claim 1.

* * * * *